(12) United States Patent
Zambova

(10) Patent No.: US 9,428,680 B2
(45) Date of Patent: Aug. 30, 2016

(54) CONDUCTIVE SILICONE MATERIALS AND USES

(71) Applicant: Dow Corning Corporation, Midland, MI (US)

(72) Inventor: Adriana Petkova Zambova, Midland, MI (US)

(73) Assignee: DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 14/774,401

(22) PCT Filed: Mar. 11, 2014

(86) PCT No.: PCT/US2014/022904
§ 371 (c)(1),
(2) Date: Sep. 10, 2015

(87) PCT Pub. No.: WO2014/150302
PCT Pub. Date: Sep. 25, 2014

(65) Prior Publication Data
US 2016/0024358 A1 Jan. 28, 2016

Related U.S. Application Data

(60) Provisional application No. 61/782,078, filed on Mar. 14, 2013, provisional application No. 61/906,458, filed on Nov. 20, 2013, provisional application No. 61/906,638, filed on Nov. 20, 2013.

(51) Int. Cl.
*C09J 183/04* (2006.01)
*H01B 1/22* (2006.01)
(Continued)

(52) U.S. Cl.
CPC ............... *C09J 183/04* (2013.01); *C09K 5/08* (2013.01); *H01B 1/22* (2013.01); *H01L 23/3737* (2013.01);
(Continued)

(58) Field of Classification Search
None
See application file for complete search history.

(56) References Cited

U.S. PATENT DOCUMENTS 3,419,593 A 12/1968 Willing
3,583,930 A * 6/1971 Ehrreich et al. ......... H01B 1/22
174/358

(Continued)

FOREIGN PATENT DOCUMENTS

EP 0971367 A1 1/2000
EP 1278211 A1 1/2003
(Continued)

OTHER PUBLICATIONS

Technical Data sheet for Silastic E RTV silicone rubber base, 13 pages, 2014.*
(Continued)

*Primary Examiner* — Robert S Loewe
(74) *Attorney, Agent, or Firm* — Dow Corning Corporation

(57) ABSTRACT

A curable silicone composition comprising a curable organosiloxane composition, copper-silver (Cu—Ag) core-shell particles, and hydrocarbon vehicle; the curable silicone composition being characterizable by: a concentration of the Cu—Ag core-shell particles of from 70 to 89 weight percent and a total concentration of silver of from 7.0 to 12 weight percent, all based on weight of the curable silicone composition; wherein the curable silicone composition has a concentration of the Cu—Ag core-shell particles and hydrocarbon vehicle such that the curable silicone composition remains curable to a conductive silicone material having a concentration of the Cu—Ag core-shell particles of from 88.0 to 92 weight percent and having a volume resistivity of less than 0.020 Ohm-centimeter measured according to Volume Resistivity Test Method, and a thermal conductivity of greater than or equal to 2.9 Watts per meter*Kelvin (W/(m*K)) measured according to Thermal Properties Test Method.

16 Claims, 1 Drawing Sheet

(51) Int. Cl.
*H01L 23/373* (2006.01)
*H01L 23/42* (2006.01)
*C09K 5/08* (2006.01)
*H05K 3/00* (2006.01)
*H05K 7/20* (2006.01)
*C08G 77/12* (2006.01)
*C08G 77/20* (2006.01)
*C08K 3/08* (2006.01)
*H01L 23/04* (2006.01)
*C08K 3/36* (2006.01)
*C08K 7/24* (2006.01)
*C08K 9/10* (2006.01)

(52) U.S. Cl.
CPC ............ *H01L 23/42* (2013.01); *H05K 3/0061* (2013.01); *H05K 7/20409* (2013.01); *C08G 77/12* (2013.01); *C08G 77/20* (2013.01); *C08K 3/36* (2013.01); *C08K 7/24* (2013.01); *C08K 9/10* (2013.01); *C08K 2003/085* (2013.01); *C08K 2003/0806* (2013.01); *C08K 2201/001* (2013.01); *H01L 23/04* (2013.01); *H01L 2224/16225* (2013.01); *H01L 2224/32225* (2013.01); *H01L 2224/73204* (2013.01); *H01L 2224/73253* (2013.01); *H01L 2924/15311* (2013.01); *H01L 2924/16152* (2013.01)

(56) References Cited

U.S. PATENT DOCUMENTS

| | | | |
|---|---|---|---|
| 4,292,223 A * | 9/1981 | Theodore | C08L 83/04 524/188 |
| 4,716,081 A * | 12/1987 | Ehrreich | B22F 1/025 252/512 |
| 4,766,176 A | 8/1988 | Lee et al. | |
| 4,777,205 A * | 10/1988 | La Scola | C08K 3/04 252/503 |
| 4,980,086 A * | 12/1990 | Hiraiwa | C08F 22/32 252/500 |
| 5,017,654 A | 5/1991 | Togashi et al. | |
| 5,075,038 A | 12/1991 | Cole et al. | |
| 5,227,093 A | 7/1993 | Cole et al. | |
| 5,466,302 A | 11/1995 | Carey et al. | |
| 5,503,777 A * | 4/1996 | Itagaki | H01L 21/486 252/500 |
| 5,611,884 A | 3/1997 | Bearinger | |
| 5,951,918 A | 9/1999 | Kuwajima et al. | |
| 6,010,646 A * | 1/2000 | Schleifstein | C08K 9/02 252/500 |
| 6,017,587 A | 1/2000 | Kleyer et al. | |
| 6,238,596 B1 | 5/2001 | Nguyen et al. | |
| 6,515,237 B2 * | 2/2003 | Kikuchi | H05K 3/4069 174/202 |
| 6,534,581 B1 | 3/2003 | Kleyer et al. | |
| 6,605,238 B2 | 8/2003 | Nguyen et al. | |
| 6,706,785 B1 | 3/2004 | Fu | |
| 6,791,163 B2 | 9/2004 | Kishimoto et al. | |
| 6,811,725 B2 | 11/2004 | Nguyen et al. | |
| 6,812,065 B1 * | 11/2004 | Kitamura | H01B 1/22 156/330 |
| 6,835,331 B2 | 12/2004 | Fujiki et al. | |
| 6,971,163 B1 | 12/2005 | Craig et al. | |
| 7,022,266 B1 | 4/2006 | Craig | |
| 7,083,859 B2 * | 8/2006 | Kuwajima | B22F 1/0003 428/428 |
| 7,671,120 B2 | 3/2010 | Matayabas, Jr. | |
| 7,850,870 B2 | 12/2010 | Ahn et al. | |
| 8,004,078 B1 * | 8/2011 | Song | C09J 7/0207 257/700 |
| 8,044,330 B2 | 10/2011 | Inaba | |
| 2002/0180027 A1 * | 12/2002 | Yamaguchi | H01L 21/486 257/700 |
| 2003/0047718 A1 | 3/2003 | Narayan et al. | |
| 2003/0077478 A1 | 4/2003 | Dani et al. | |
| 2005/0051360 A1 | 3/2005 | Su et al. | |
| 2006/0145125 A1 * | 7/2006 | Kuwajima | H01B 1/22 252/500 |
| 2007/0164260 A1 * | 7/2007 | Kuwajima | H01B 1/02 252/512 |
| 2007/0213429 A1 | 9/2007 | Cheng et al. | |
| 2008/0023665 A1 | 1/2008 | Weiser et al. | |
| 2008/0057325 A1 * | 3/2008 | Sakurai | C09J 183/04 428/447 |
| 2008/0300358 A1 | 12/2008 | Cook et al. | |
| 2009/0186219 A1 | 7/2009 | Inaba | |
| 2009/0235972 A1 | 9/2009 | Fukushima et al. | |
| 2009/0271238 A1 | 10/2009 | Himlet et al. | |
| 2010/0084001 A1 | 4/2010 | Tsunormura et al. | |
| 2011/0067751 A1 | 3/2011 | Meakin et al. | |
| 2011/0073344 A1 * | 3/2011 | Zhang | C08G 59/34 174/50 |
| 2011/0126878 A1 | 6/2011 | Hacke et al. | |
| 2011/0147672 A1 | 6/2011 | Yang et al. | |
| 2012/0312467 A1 | 12/2012 | Kleine Jaeger et al. | |
| 2013/0092423 A1 * | 4/2013 | Hamada | C09D 11/52 174/257 |
| 2014/0332072 A1 | 11/2014 | Beaucarne et al. | |
| 2014/0345685 A1 | 11/2014 | Albaugh et al. | |
| 2014/0370311 A1 | 12/2014 | Boulord et al. | |

FOREIGN PATENT DOCUMENTS

| | | |
|---|---|---|
| JP | 2004-027134 A | 1/2004 |
| JP | 2004165357 A | 6/2004 |
| JP | 2005162827 A | 6/2005 |
| WO | 2011/101788 A1 | 8/2011 |
| WO | 2013090498 A1 | 6/2013 |
| WO | 2014159792 A1 | 10/2014 |

OTHER PUBLICATIONS

Hai, H. T. et al., Oxidative Behavior of Cu—Ag Core-Shell Particles for Solar Cell Applications, 2013, doi: http://dx.doi.org/10.1016/j.jallcom.2013.02.048 (Journal of Alloys and Compounds).
Kim S. J., et al., Fabrication of conductive interconnects by Ag migration in Cu—Ag core-shell nanoparticles, Applied Physical Letters, 2010; 96:144101-1 to 144101-3.
Beaucarne et al.; Silicone-base electrically conductive adhesives for MWT Modules; MWT Workshop, Amsterdam Nov. 21, 2012.
Li J. et al.; Aspect Ratio and Loading Effects of Multiwall Carbon Nanotubes in Epoxy for Electrically Conductive Adhesive; J Adhesion Sci Tech 2008 v22 No. 14 pp. 271-283.
Montemayor; Electrically Conductive Silicone Adhesive, Proceedings of SMTA International Conference, Sep. 2002.
Stoner et al.; Graphenated carbon nanotubes for enhanced electrochemical double layer capacitor performance; Appl. Phys. Lett. 2011 v99 No. 18 pp. 183104-1 to 183104-3.
Zemen Y et al.; Conductive Adhesive Based on Carbon Nanotubes for Solar Cells Interconnection; Photovoltaic Spec Conf PVSC 2012 38th IEEE.
John Albaugh et al., U.S. Appl. No. 14/650,733, filed Jun. 9, 2015.
John Albaugh et al., U.S. Appl. No. 14/775,789, filed Sep. 14, 2015.
PCT/US2014/022904 International Search Report dated Jun. 6, 2014.

* cited by examiner

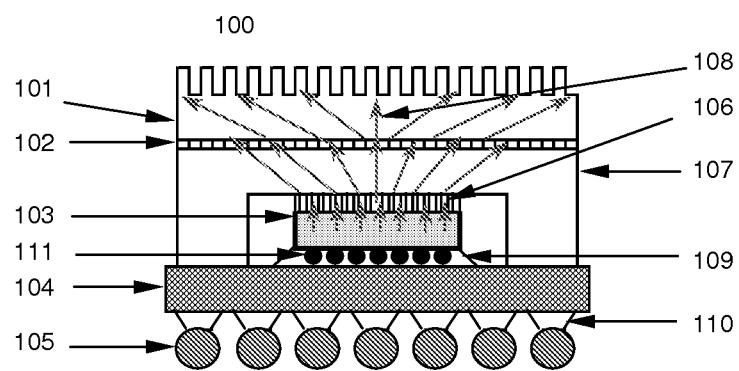

CONDUCTIVE SILICONE MATERIALS AND USES

CROSS REFERENCE TO RELATED APPLICATIONS

This application is a U.S. national stage filing under 35 U.S.C. §371 of PCT Application No. PCT/US14/22904 filed on 11 Mar. 2014, currently pending, which claims the benefit of U.S. Provisional Patent Applications No. 61/782,078 filed 14 Mar. 2013; No. 61/906,458 filed 20 Nov. 2013; and No. 61/906,638 filed 20 Nov. 2013, all three of which being filed under 35 U.S.C. §119 (e). PCT Application No. PCT/US14/22904 and U.S. Provisional Patent Applications Nos. 61/782,078, 61/906,458, and 61/906,638 are hereby incorporated by reference.

Our invention includes curable silicone compositions, thermally conductive silicone materials made therefrom, methods of making and using the compositions and materials, and devices containing the compositions and materials.

Thermally conductive (TC) materials function by conducting heat away from a heat source. There are varieties of TC materials and diverse manufactured articles that use TC materials; examples are electronic devices such as integrated circuits and electrical devices such as electric motors and toasters.

The need to manage heat in electrical devices is increasing. For example, electronic devices are becoming smaller, generating more heat per unit area. Electronic devices based on silicon carbide have higher normal operating temperatures than electronic devices based on silicon.

Many factors affect choosing a suitable TC material for a particular heat transfer use, including the factors thermal performance, cost, and material stability. For example, many metals are thermally conductive, but they may be prone to react with acids, moisture, oxygen, or functional groups of organic, organometallic, or organosilicon materials. Reactive metals such as copper are disfavored for oxygen-containing applications such as environments where warm air can corrode and oxidize the metal to a metal oxide, which may not be thermally conductive. Noble metals are resistant to corrosion and oxidation, but may be toxic (e.g., osmium), expensive (gold, silver or platinum), or weak thermal conductors (e.g., osmium and palladium). Some metals may conduct heat and electricity, and so may be acceptable for use in applications requiring both types of conductivities, but unacceptable in thermally conducting but electrically insulating uses.

Artisans have made different electrically and/or thermally conductive compositions from varieties of ingredients. Some examples are mentioned in U.S. Pat. No. 5,951,918 to Kuwajima et al.; U.S. Pat. No. 6,017,587 to Kleyer et al.; U.S. Pat. No. 6,238,596 B1 and U.S. Pat. No. 6,605,238 B2 to M. Nguyen et al.; U.S. Pat. No. 6,811,725 B2 to Nguyen et al.; U.S. Pat. No. 7,671,120 B2 to J. C. Matayabas, Jr.; US 2003/0077478 A1 to Dani et al.; US 2005/0051360 A1 to Su et al.; US 2008/0023665 A1 to Weiser et al.; US 2011/0147672 A1 to H. Yang, et al.; WO 2011/101788 A1 to K. Jäger, et al.; and WO 2013/090498 A1 to H. Jiang, et al.

We (the present inventors) found problems with some prior art compositions. For instance, the prior art struggles to provide a functional curable composition wherein total concentration of silver in the composition is extremely low, e.g., below 15 wt % and yet the cured product thereof has good electrical and thermal conductivity and improved tensile properties (e.g., lower modulus) for enhanced use as a thermal interface material (TIM) with smaller electronic devices and SiC-based electronic devices. The prior art also struggles to employ Cu—Ag core-shell particles while avoiding the reported oxidation of the copper(0) of the Cu—Ag core-shell particles when the particles are exposed to heated air and/or damp conditions (e.g., relative humidity >50%), such as is commonly used during manufacture and use of electronic devices. Also, prior art curable compositions with highly conductive metal particles as the only solid filler may have too little viscosity and exhibit too much slump, bleeding, dripping, and/or filler settling during use in manufacturing, e.g., screen printing thereof.

Our efforts to solve these technical problems led us to improved curable silicone compositions and conductive silicone materials.

BRIEF SUMMARY OF THE INVENTION

The present invention includes curable silicone compositions, thermally conductive silicone materials made therefrom, methods of making and using the compositions and materials, and devices containing the compositions and materials. Embodiments include:

A curable silicone composition comprising a curable organosiloxane composition, copper-silver (Cu—Ag) core-shell particles, and hydrocarbon vehicle; the curable silicone composition being characterizable by: a concentration of the Cu—Ag core-shell particles of from 80 to 89 weight percent and a total concentration of silver of from 7.0 to 12 weight percent, all based on weight of the curable silicone composition; and wherein the curable silicone composition has a concentration of the Cu—Ag core-shell particles and hydrocarbon vehicle such that the curable silicone composition remains curable to a conductive silicone material having a concentration of the Cu—Ag core-shell particles of from 88.0 to 92 weight percent and having a volume resistivity of less than 0.020 Ohm-centimeter measured according to Volume Resistivity Test Method and a thermal conductivity of greater than or equal to 2.9 Watts per meter*Kelvin (W/(m*K)) measured according to Thermal Properties Test Method.

A conductive silicone material (CSM) that is a product of curing the curable silicone composition and is characterizable by a volume resistivity of less than 0.0010 Ohm-centimeter measured according to Volume Resistivity Test Method and a thermal conductivity of greater than or equal to 2.9 W/(m*K) measured according to Thermal Properties Test Method.

An electrical device sequentially comprising a heat generating electrical component, the conductive silicone material disposed in thermal communication and contact with the heat generating electrical component, and a heat dissipator disposed in thermal communication and contact with the conductive silicone material.

A method of manufacturing the electrical device.

A method of preparing a thermally conductive material, the method comprising curing the curable silicone composition to give the product of curing thereof as a curable thermally conductive material having a thermal conductivity of greater than or equal to 2.9 W/(m*K) measured according to Thermal Properties Test Method.

Use in an electrical device of the product of curing the curable silicone composition as a thermally conductive material having a thermal conductivity of greater than or equal to 2.9 W/(m*K) measured according to Thermal Properties Test Method.

The invention may be used in electrical components, end-user devices, and methods of their manufacture.

BRIEF DESCRIPTION OF THE DRAWING(S)

FIG. 1 shows an embodiment of a multi-chip package containing the CSM of this invention.

DETAILED DESCRIPTION OF THE INVENTION

The Summary and Abstract are incorporated here by reference. The present invention provides the curable composition, the conductive silicone material (CSM), the electrical device, and the method of manufacturing the electrical device. The CSM may be prepared by curing the curable silicone composition and removing the hydrocarbon vehicle. The removing step may be performed simultaneously with the curing step, after the curing step, or a portion simultaneously with the curing step and a portion after curing step. The CSM having a concentration of the Cu—Ag core-shell particles of from 88.0 to 92 weight percent is believed to be electrically and thermally conductive, respectively having a volume resistivity of less than 0.020 Ohm-centimeter measured according to Volume Resistivity Test Method and a thermal conductivity of greater than or equal to 2.9 Watts per meter*Kelvin (W/(m*K)) measured according to Thermal Properties Test Method. The present invention, however, also separately contemplates: (a) any embodiments that have a volume resistivity of less than 0.020 Ohm-centimeter measured according to Volume Resistivity Test Method and a thermal conductivity of less than 2.9 W/(m*K) measured according to Thermal Properties Test Method; and (b) any embodiments having a volume resistivity of greater than 0.020 Ohm-centimeter measured according to Volume Resistivity Test Method and a thermal conductivity of greater than or equal to 2.9 W/(m*K) measured according to Thermal Properties Test Method. The CSM may have improved tensile properties for enhanced use as a thermal interface material (TIM) with smaller electronic devices and SiC-based electronic devices. For example, the cured product would have higher elongation and/or lower modulus (lower mechanical stress) than elongation and tensile strength of products of curing compositions with high silver concentrations, e.g., >80 weight percent).

"May" confers a choice, not an imperative. "Optionally" means is absent, alternatively is present. "Contact" comprises effective touching, e.g., as for facilitating reaction. The contact may be direct touching, alternatively indirect touching, e.g., via an interposed adhesive or surface activation layer. The "communication" comprises effective transmission. The transmission may be direct transmission, alternatively indirect transmission, e.g., via an interposed adhesive or surface activation layer. Any reference herein to a Group or Groups of elements or the Periodic Table of the Elements means those of the 2011 edition of the Periodic Table of the Elements promulgated by IUPAC (International Union of Pure and Applied Chemistry). Unless indicated otherwise by specific statement or context (e.g., salt or chelate), any reference to a metal, metal alloy, or metal blend herein refers to the metallic (non-ionic, formal oxidation state 0) form of the relevant element. All "wt %" (weight percent) are, unless otherwise noted, based on total weight of the ingredients used. Ingredients of each composition, mixture, or other material add up to 100 wt %. Any Markush group comprising a genus and subgenus therein includes the subgenus in the genus, e.g., in Markush group "R is hydrocarbyl or alkenyl," R may be alkenyl, alternatively R may be hydrocarbyl, which includes, among other subgenuses, alkenyl.

As used herein, thermal conductivity (TC or λ) refers to bulk heat conductivity. Kelvin refers to temperature in degrees Kelvin. Thermal impedance (Z) is measured through a bond line thickness (BLT)=50 microns (μm). Unless it is indicated otherwise herein, all thermal conductivity and thermal impedance values are measured according to Thermal Properties Test Method described later. As used herein, volume resistivity (φ and electrical conductivity (K) refer to bulk volume resistivity and bulk electrical conductivity. If a volume resistivity value and electrical conductivity value inadvertently conflict, the volume resistivity value controls. Unless it is indicated otherwise herein, all volume resistivity values are measured according to Volume Resistivity Test Method described later.

The curable silicone composition comprises the curable organosiloxane composition, copper-silver (Cu—Ag) core-shell particles, and hydrocarbon vehicle. A de minimis amount of free Ag particles may be present in the curable silicone composition and/or CSM as a result of a sloughing off of bits and pieces of the Ag shell from the Cu—Ag core-shell particles during preparation and/or use of the curable silicone composition and/or CSM. The curable silicone composition contains less than 2 wt %, alternatively <1 wt %, alternatively <0.5 wt %, alternatively <0.1 wt %, alternatively 0.0 wt % free Ag particles. Similarly, the curable silicone composition contains less than 2 wt %, alternatively <1 wt %, alternatively <0.5 wt %, alternatively <0.1 wt %, alternatively 0.0 wt % Au particles. The curable silicone composition may lack both free Ag particles and Au particles.

The curable silicone composition may lack an organic material or source of oxygen that would otherwise oxidize Cu(0) at 200° C. The curable silicone composition may lack an epoxy material, a polyimide material, or both. Alternatively, the curable silicone composition may lack any organic polymer, which includes the epoxy and polyimide materials.

The curable silicone composition may be curable at a temperature less than or equal to 160° C. For example, the curable silicone composition may curable at a temperature of from 20° to 160° C., alternatively from 30° to 155° C., alternatively from 40° C. to 150° C. For example, the curable silicone composition may curable at a temperature of <130° C., alternatively <120° C., alternatively <100° C., alternatively <80° C., alternatively <75° C.; and at a temperature of >20° C., alternatively >25° C., alternatively >30° C., alternatively >40° C. Advantageously, the curable silicone composition may curable under curing conditions comprising an air atmosphere at ambient pressure (e.g., at 101 kilopascals pressure) and any one of the aforementioned temperatures such that the curing conditions do not materially result in oxidation of copper(0) of the Cu core, alternatively minimize oxidation of copper(0) of the Cu core such that the resulting CSM has the volume resistivity of less than 0.020 Ohm-centimeter. Alternatively, the curable silicone composition may be curable under vacuum or under an inert gas atmosphere at ambient pressure and any one of the aforementioned temperatures. The inert gas atmosphere may be a gas of molecular nitrogen, helium, or argon.

The curable silicone composition may be a curable silicone composition comprising a blend of the following ingredients: a hydrocarbon vehicle, wherein the hydrocarbon vehicle is characterizable by a boiling point from 100 to 360 degrees Celsius; a curable organosiloxane composition;

and Cu—Ag core-shell particles; wherein the total concentration of silver is <15 wt % based on weight of the curable silicone composition. The curable silicone composition may lack, alternatively further comprise a mechanical thixotropic filler (MTF), which may beneficially function to produce an embodiment of the curable silicone composition having a Thixotropic Index($\eta_1/\eta_{10}$) of from 3 to 10, e.g., from 2.5 to 10, alternatively from 2.7 to 10, alternatively from 3.0 to 10. Thixotropic Index($\eta_1/\eta_{10}$) is measured according to the method described later. Such compositions having Thixotropic Index($\eta_1/\eta_{10}$) of from 3 to 10 are printable. The curable silicone composition remains curable to a conductive silicone material having a volume resistivity of less than 0.0010 Ohm-centimeter and a thermal conductivity of greater than or equal to 2.9 W/(m*K). The MTF may also function to enhance the electrical and/or thermal conductivity(ies) of the CSM. The Cu—Ag core-shell particles and any conductivity enhancing MTF may be collectively referred to herein as conductive filler.

For example the curable silicone composition may comprise a blend of the following ingredients: a hydrocarbon vehicle at a concentration of from 4 to 20 wt % based on weight of the curable silicone composition, wherein the hydrocarbon vehicle is characterizable by a boiling point from 100 to 360 degrees Celsius; a curable organosiloxane composition at a concentration of from 7 to 25 wt % based on weight of the curable silicone composition; and Cu—Ag core-shell particles at a concentration of from 70 to 89 wt % based on weight of the curable silicone composition; wherein the total concentration of silver is from 7.0 to 14.0 wt % based on weight of the curable silicone composition. The curable silicone composition remains curable to a conductive silicone material having a volume resistivity of less than 0.020 ohm-centimeter (Ohm-cm).

Alternatively, the curable silicone composition may comprise a blend of the following ingredients: a hydrocarbon vehicle at a concentration of from 1 to 15 wt % based on weight of the curable silicone composition, wherein the hydrocarbon vehicle is characterizable by a boiling point from 100 to 360 degrees Celsius; a curable organosiloxane composition at a concentration of from 7 to 25 wt % based on weight of the curable silicone composition; and Cu—Ag core-shell particles at a concentration of from 80 to 92 wt % based on weight of the curable silicone composition; and the total concentration of silver is from 9 to 12 weight percent, all based on weight of the curable silicone composition. The curable silicone composition has a concentration of the Cu—Ag core-shell particles and hydrocarbon vehicle such that the curable silicone composition remains curable to a conductive silicone material wherein the Cu—Ag core-shell particles are at a concentration of from 88.0 to 92 wt % and having a volume resistivity of less than 0.020 ohm-centimeter (Ohm-cm) and a thermal conductivity of greater than or equal to 2.9 W/(m*K). The phrase "curable to a conductive silicone material having a concentration of the Cu—Ag core-shell particles of from 88.0 to 92 weight percent" means the CSM lacks the hydrocarbon vehicle of the curable silicone composition and the CSM has a quantity of the Cu—Ag core shell particles, relative to the (total) quantity of the CSM, of from 88.0 parts of the Cu—Ag core shell particles per 100 parts of the CSM to 92 parts of the Cu—Ag core shell particles per 100 parts of the CSM. In some embodiments the curable silicone composition has a concentration of the Cu—Ag core-shell particles and hydrocarbon vehicle such that the curable silicone composition is curable to embodiments of the CSM wherein the Cu—Ag core-shell particles in the CSM are at a concentration of from 88.0 to 91.0 wt %, alternatively from 88.0 to 90.0 wt %, the CSM has a volume resistivity of less than 0.0010 Ohm-cm, the CSM has a thermal conductivity of greater than or equal to 5 W/(m*K), or a combination of any two or more of said concentration, volume resistivity, and thermal conductivity values.

The curable silicone composition may be characterizable by (i.e., may be curable to a CSM having) a volume resistivity less than 0.010 Ohm-cm, alternatively <0.0010 Ohm-cm, alternatively <0.00090 Ohm-cm, alternatively <0.00080 Ohm-cm, alternatively <0.00070 Ohm-cm, alternatively <0.00060 Ohm-cm, alternatively <0.00050 Ohm-cm, alternatively <0.00040 Ohm-cm. The volume resistivity is >0 Ohm-cm, e.g., ≥0.00001 Ohm-cm. While typically the lower the volume resistivity of the CSM the better, in some embodiments the volume resistivity may be >0.00001 Ohm-cm, alternatively >0.00005 Ohm-cm, alternatively >0.00009 Ohm-cm, alternatively >0.00010 Ohm-cm, alternatively >0.00020 Ohm-cm, alternatively >0.00030 Ohm-cm. The curable silicone composition may also be characterizable by (i.e., may be curable to a CSM having) a thermal conductivity of greater than or equal to 2.9 W/(m*K), alternatively ≥3.0 W/(m*K), alternatively ≥4.0 W/(m*K), alternatively ≥5.0 W/(m*K), alternatively ≥6.0 W/(m*K), alternatively ≥7.0 W/(m*K), alternatively ≥8.0 W/(m*K), alternatively ≥9.0 W/(m*K), or any one of the aforementioned thermal conductivity values, all measured according to Thermal Properties Test Method. Alternatively or additionally, the CSM has a thermal conductivity of less than 15 W/(m*K), alternatively <14 W/(m*K), alternatively <13 W/(m*K), alternatively <12 W/(m*K), alternatively <11 W/(m*K).

The hydrocarbon vehicle is a liquid collection of molecules wherein each molecule consists of carbon and hydrogen atoms, including one or more than one isotopic forms of carbon and hydrogen atoms, respectively. Each molecule has carbon-carbon bonds wherein each carbon-carbon bond independently is a single, double, triple, or aromatic bond. Each molecule independently may be a saturated hydrocarbon, unsaturated hydrocarbon, aromatic hydrocarbon, or a combination of any two or three thereof. Each molecule independently may be acyclic or cyclic, or a combination of acyclic and cyclic portions. Each acyclic molecule or portion independently may be branched or unbranched. Each cyclic molecule or portion independently may be aromatic or non-aromatic. Additionally, each cyclic molecule or portion independently may be monocyclic or polycyclic, including bicyclic or tricyclic. Each polycyclic molecule or portion may be simple (separate rings that do not share atoms) or complex (having at least two rings that share at least one atom). Examples of complex polycyclic molecules are bridged, spirocyclic, and fused polycyclic. Each ring of the polycyclic molecule independently may be aromatic or non-aromatic. The hydrocarbon vehicle may be from any one or more of the following classes: alkane, alkene, alkyne, cycloalkane, cycloalkene, cycloalkyne, and aromatic hydrocarbons. The hydrocarbon vehicle may be a mixture of any two or more hydrocarbons of the same or different classes. The mixture of hydrocarbons of the same class may be a mixture of alkanes such as a mixture of unbranched alkanes (normal-alkanes) or a mixture of branched alkanes (e.g., an isoalkanes mixture, neo-alkanes mixture, or tertiary-alkanes mixture). For example, the isoalkanes mixture may comprise at least two of ($C_9$-$C_{12}$)isoalkanes, at least two of ($C_{12}$-$C_{16}$) isoalkanes or at least two of ($C_{16}$-$C_{22}$)isoalkanes. The mixture of hydrocarbons from different classes may be a mixture of alkanes and aromatic hydrocarbons or a mixture of alkanes and alkenes. In some embodiments the hydrocarbon vehicle may be an alkane or mixture of two or more alkanes. The mixture of alkanes may lack normal alkanes. In some embodiments the hydrocarbon vehicle is the isoalkanes mixture.

The hydrocarbon vehicle is also characterizable by a boiling point of at least 100 degrees Celsius (° C.), alternatively from 100 to 360° C. The particular boiling point of the hydrocarbon vehicle is not critical so long as it is above 100° C. and yet not so high that the hydrocarbon vehicle could not be substantially removed during curing of the curable silicone composition and/or thereafter. The "substantially removed" means removal of at least 50 volume percent (vol %), alternatively at least 75 vol %, alternatively at least 90 vol %, alternatively at least 98 vol %, alternatively at least 99 vol % removed, based on starting volume of the hydrocarbon vehicle and an amount such that the CSM has <5 wt %, alternatively <4 wt %, alternatively <3 wt %, alternatively <2 wt %, alternatively <1 wt % of hydrocarbon vehicle after curing has been stopped or completed. The amount of hydrocarbon vehicle remaining in the CSM after curing may be equal to (weight of the hydrocarbon vehicle used in the curable silicone composition) minus the weight lost during curing. The weight lost during curing may equal weight of the curable silicone composition before curing minus weight of the CSM. Alternatively, thermal gravimetric analysis (TGA) may be employed to measure weight change upon heating and pyrolysis gas chromatograph-mass spectrometry may be employed to quantitatively analyze (identify and quantify) materials that have left the curable silicone composition or CSM prepared therefrom during curing of the former. The hydrocarbon vehicle can be removed without degrading the CSM to a degree of decomposition whereat the CSM would not be able to meet its electrical, thermal, material, or all three limitations described herein.

Additionally, an embodiment of the hydrocarbon vehicle with a particular boiling point or boiling point range may be used to accommodate beneficial curing conditions for curing the curable silicone composition. For example, the boiling point or boiling point range temperature range may beneficially facilitate shrinkage of volume of material during curing such that the volume of the curable silicone composition immediately prior to curing is higher than the volume of the resulting CSM after curing. The shrinkage may advantageously be at a relatively slow and steady rate such that packing of the conductive filler in the curable silicone composition is improved, resulting in lower volume resistivity and higher electrical and/or thermal conductivity of the CSM than would be obtained with a comparative CSM having a hydrocarbon vehicle having a boiling point less than 100° C., especially less than 80° C., alternatively <60° C., alternatively <50° C. The rate of shrinkage may be adjusted to improve packing of the conductive filler in the CSM.

For most applications, a maximum boiling point (i.e., an end boiling point) of 360° C. is sufficient for the hydrocarbon vehicle. When the hydrocarbon vehicle is a mixture of different hydrocarbon molecules, the hydrocarbon vehicle may be characterizable by an initial boiling point of lowest boiling molecules and an end boiling point of highest boiling molecules. For example, the hydrocarbon vehicle may have an initial boiling point greater than 150° C. and an end boiling less than 300° C.; alternatively an initial boiling point of greater than 210° C. and an end boiling point of less than 270° C.; alternatively an initial boiling point of >160° C. and an end boiling point <205° C.; alternatively an initial boiling point of >210° C. and an end boiling point <270° C.; alternatively an initial boiling point of >270° C. and an end boiling point <355° C.

The hydrocarbon vehicle may be present in the curable silicone composition at a concentration of from 4 to 25 wt %, alternatively from 4 to 15 wt %, alternatively from 4.5 to 15 wt %, alternatively from 4.5 to 12 wt %, all based on weight of the curable silicone composition. Alternatively, especially for the curable silicone composition having improved thermal conductivity (i.e., being curable to an embodiment of the CSM having improved thermal conductivity), the hydrocarbon vehicle may be present in the curable silicone composition at a concentration of from 1 to 15 wt %, alternatively 1 to 13 wt %, alternatively 1 to 12 wt %, e.g., from 1 to 6 wt %, e.g., 1, 2, 3, 4, 5 wt %, alternatively from 4 to 12 wt %, all based on weight of the curable silicone composition.

The "copper-silver core-shell particles" or Cu—Ag core-shell particles mean a finely divided composite having an inner part and an outer layer, wherein the inner part (core) is a solid form of the element having atomic number 29 and wherein the outer layer (shell) is a solid form of the element having atomic number 47 (Ag). For embodiments of the CSM having the volume resistivity of less than 0.020 Ohm-cm, the concentration of the Cu—Ag core-shell particles in the curable silicone composition may be from 70 to 89 wt %, alternatively from 75 to 89 wt %, alternatively from 79.5 to 86.4 wt %, alternatively from 79.9 to 86.0 wt %, all based on weight of the curable silicone composition.

For embodiments of the CSM having the thermal conductivity of greater than or equal to 2.9 W/(m*K), alternatively having the volume resistivity of less than 0.020 Ohm-cm and having the thermal conductivity of greater than or equal to 2.9 W/(m*K), the concentration of the Cu—Ag core-shell particles in the CSM should be at least 88.0 wt %, alternatively at least 88.5 wt %, alternatively at least 88.6 wt %, alternatively at least 89.0 wt %, all based on the weight of the curable silicone composition. For CSM having an improved tensile property (e.g., an elongation at break of at least 50%), the maximum concentration of the Cu—Ag core-shell particles in the CSM may be at most 92.0 wt %, alternatively at most 91.0 wt %, alternatively at most 90.1 wt %, alternatively at most 90.0 wt %, alternatively at most 89.9 wt %, all based on the weight of the curable silicone composition. This may be readily achieved with the curable silicone composition that has a concentration of the Cu—Ag core-shell particles and hydrocarbon vehicle such that the curable silicone composition remains curable to the CSM having any one of the immediately foregoing concentrations of the Cu—Ag core-shell particles. The concentration of the Cu—Ag core-shell particles in the CSM may be calculated from the concentration of the Cu—Ag core-shell particles in the curable silicone composition by omitting the weight of the hydrocarbon vehicle used in the curable silicone composition, and calculating the concentration of the Cu—Ag core-shell particles in the CSM on the theoretical basis of the CSM lacking the hydrocarbon vehicle but otherwise having the same total weight as the total weight of the curable silicone composition. In such embodiments, the curable silicone composition has a concentration of the Cu—Ag core-shell particles and hydrocarbon vehicle such that the curable silicone composition is curable to said embodiments of the CSM wherein the Cu—Ag core-shell particles are at any one of the immediately foregoing concentrations, and therefore the CSM has a volume resistivity of less than 0.020 Ohm-cm and a thermal conductivity of greater than or equal to 2.9 W/(m*K).

Conversely, the concentration of the Cu—Ag core-shell particles in the curable silicone composition needed to prepare an embodiment of the CSM having the thermal conductivity of greater than or equal to 2.9 W/(m*K), i.e., an embodiment of the CSM having a concentration of the Cu—Ag core-shell particles of at least 88.0 wt %, e.g., from 88.0 to 92.0 wt %, may be varied over a wider range than the aforementioned concentration of the Cu—Ag core-shell particles in the CSM. This varying may be done by adjusting the concentration of the hydrocarbon vehicle used in the curable silicone composition, since the hydrocarbon vehicle is eventually removed during and/or after curing of the curable silicone composition, and therefore the hydrocarbon vehicle ultimately is absent in the CSM. So, what may be a relatively low concentration of the Cu—Ag core-shell particles (e.g., 70 wt %) in the curable silicone composition due to a high concentration of hydrocarbon vehicle (e.g., 18 to 20 wt %) therein may end up to be a significantly higher concentration of the Cu—Ag core-shell particles (88.0 to 90.0 wt %) in the CSM after the curable silicone composition is cured and the hydrocarbon vehicle is removed therefrom. For example, in the curable silicone composition the Cu—Ag core-shell particles may be at a concentration of from 73 to 91 wt % based on weight of the curable silicone composition and the hydrocarbon vehicle may be at a concentration of from 15 wt % to 1 wt %, respectively, such that the concentration of the Cu—Ag core-shell particles in the resulting CSM is from 88.0 to 92.0 wt %, respectively. The resulting CSM is prepared by curing the curable silicone composition and removing the hydrocarbon vehicle therefrom.

The Ag shell covers some, alternatively most, alternatively all of the Cu core. Even when the Ag shell does not cover the entire Cu core, the Ag shell covers enough of the Cu core such that the volume resistivity of the CSM may be maintained below 0.020 Ohm-cm, alternatively <0.0010 Ohm-cm. The Ag shell may cover a substantial portion of the Cu core such that oxidative stability of the copper(0) of the core during curing of the curable silicone composition and/or during use of the resulting CSM may be maintained. The Cu—Ag core-shell particles may be unsintered, thereby allowing the curable organosiloxane composition of the curable silicone composition, and the cured binder matrix resulting from curing thereof, to surround and encapsulate an agglomeration of the Cu—Ag core-shell particles, thereby inhibiting contact of ambient molecular oxygen with the Cu cores. To achieve this protection of the Cu cores from oxidation, it is not necessary for the curable organosiloxane composition, and the resulting cured binder matrix, to surround and encapsulate each Cu—Ag core-shell particle. In some locations on the Cu—Ag core-shell particles in the curable silicone composition and CSM, there may be direct physical touching between such Cu—Ag core-shell particles. There may also be some voids or gas pockets between the Cu—Ag core-shell particles where air or other gaseous atmosphere (e.g., inert gas) may have been trapped during preparation of the curable silicone composition and/or CSM.

Alternatively, even where some of the exposed Cu(0) of the cores is oxidized during the curing of the curable silicone composition or use of the resulting CSM, the concentration of Ag in the Cu—Ag core-shell particles may be sufficient for the volume resistivity of the CSM to be maintained below 0.020 Ohm-cm, alternatively <0.0010 Ohm-cm via electrical conduction through a continuous path through the CSM via the Ag shells. Therefore, the Cu cores may be substantially electrically conductive as for Cu(0), alternatively the Cu cores may be oxidized to Cu oxides at least exposed surfaces thereof such that the electrical conductivity of the Cu cores is significantly decreased compared to that for Cu(0) only cores, alternatively the electrical conductivity of the Cu cores may be somewhere in between these two characteristics.

Analogously, even where some of the exposed Cu(0) of the cores is oxidized during the curing of the curable silicone composition or use of the resulting CSM, the concentration of Ag in the Cu—Ag core-shell particles may be sufficient for the thermal conductivity of the CSM to be maintained at 2.9 W/(m*K) or greater, alternatively ≥3.0 W/(m*K), alternatively ≥4.0 W/(m*K), alternatively ≥5.0 W/(m*K), alternatively ≥6.0 W/(m*K), alternatively ≥7.0 W/(m*K), alternatively ≥8.0 W/(m*K), alternatively ≥9.0 W/(m*K), or any one of the aforementioned thermal conductivity values, via thermal conduction through a continuous path through the CSM via the Ag shells. Therefore, the Cu cores may be substantially thermally conductive as for Cu(0), alternatively the Cu cores may be oxidized to Cu oxides at least exposed surfaces thereof such that the thermal conductivity of the Cu cores is significantly decreased compared to that for Cu(0) only cores, alternatively the thermal conductivity of the Cu cores may be somewhere in between these two characteristics.

The concentration of silver in the Cu—Ag core-shell particles may be from 5 to 20 wt %, alternatively from 6 to 18 wt %, alternatively from 8 to 16 wt %, alternatively from 9 to 14 wt % (e.g., 9 wt %, 10 wt %, 11 wt %, or 12 wt %), all based on weight of the Cu—Ag core-shell particles.

Total concentration of silver in the curable silicone composition may be 14.0 wt % or less, alternatively <14 wt %, alternatively <13 wt %, alternatively 12.0 wt %, alternatively <12 wt %. Total concentration of silver in the curable silicone composition may be at least 6.5 wt %, alternatively at least 7.0 wt %, alternatively >7 wt %, alternatively at least 8 wt %, alternatively >8 wt %. For example, the total silver concentration may be from 7.0 to 14.0 wt %, alternatively from 7.0 to 12 wt %, alternatively from 7.1 to 12.0 wt %, alternatively from 7.5 to 12.0 wt %, alternatively from 8.5 to 11 wt %. Alternatively, especially for the curable silicone composition having improved thermal conductivity (i.e., being curable to an embodiment of the CSM having improved thermal conductivity), the total concentration of silver in the curable silicone composition may be from 9 to 12 wt %, alternatively from 9.5 to 11.5 wt %, alternatively from 9.6 to 11.2 wt %, alternatively from 10.0 to 11.0 wt %, all based on the weight of the curable silicone composition.

The Cu—Ag core-shell particles may be in the shape of cuboidals, flakes, granules, irregulars, rods, needles, powders, spheres, or a mixture of any two or more of cuboidals, flakes, granules, irregulars, rods, needles, powders, and spheres. Typically, the Cu—Ag core-shell particles have a median particle size of from 0.5 to 20 microns, alternatively from 1 to 15 microns, alternatively from 2 to 10 microns. The particle sizes may be determined by particle size distribution analysis and reported as a median particle size in μm (D<50), alternatively as the diameter in μm below which 10% (D10), 50% (D50) and 90% (D90) of the cumulative particle size distribution is found. Prior to preparing the curable silicone composition, the particle size may be determined with a sample of Cu—Ag core-shell particles in dry form or dispersed in a dispersant (e.g., water) using laser diffraction or particle size analyzer instrument. For example, the MALVERN MASTERSIZER S particle size analyzer instrument (Malvern Instruments, Malvern, Worcestershire, UK) may be used with particles having a size in the range of from 300 nm to 1000 μm; and the MICROTRAC NANOTRAC UPA150 particle size analyzer instrument (Microtrac, Inc., Montgomeryville, Pa., USA) may be used with particles having a size in the range of from 5 nm to 4 µm. Atomic force microscopy (AFM), scanning electron microscopy (SEM) or transmission electron microscopy (TEM) may be used to measure the particle sizes of Cu—Ag core-shell particles after the particles have been dispersed in the curable silicone composition or after curing same to the CSM. Unless stated otherwise herein, any particle size measurement is for particles prior to preparing the curable silicone composition containing same.

The Cu—Ag core-shell particles may be surface treated. For example, such particles may be surface treated to improve "wetability" by the curable organosiloxane composition and/or dispersability in the curable silicone composition, CSM, or both. The surface treatment may comprise contacting the particles with a chemical substance such as an acid, base, compatibilizer, lubricant, or processing aid. The chemical substance may be aqueous sodium hydroxide, a ($C_4$-$C_{28}$)carboxylic acid or ester (e.g., a fatty acid or fatty acid ester), the hydrocarbon vehicle, a silicon-containing compound, or sulfuric acid. The silicon-containing compound may be an organochlorosilane, organosiloxane, organodisilazane, organoalkoxysilane. The lubricant may be used to treat the Cu—Ag core-shell particles during a milling process of making Cu—Ag core-shell flakes from Cu—Ag core-shell powder to prevent the Cu—Ag core-shell powder from cold welding or forming agglomerates. The chemical substance may, alternatively may not, be removed from the Cu—Ag core-shell particles before the particles are mixed with other ingredients of the curable silicone composition. Even if the treated particles are washed with solvent after the treating process, some chemical substances such as the lubricant or compatibilizer may remain chemisorbed on the surface of the particles.

The "mechanical thixotropic filler" or MTF is any finely divided solid lacking electrically conductive metal and that modulates the Thixotropic Index($\eta_1/\eta_{10}$) without increasing volume resistivity of the curable silicone composition above 0.020 Ohm-cm, alternatively >0.0010 Ohm-cm, or alternatively > any one of the other aforementioned volume resistivity values; and without decreasing thermal conductivity of the curable silicone composition below 2.9 W/(m*K), alternatively <3 W/(m*K), or alternatively <any one of the aforementioned Thermal Conductivity values. As noted, the MTF may enhance electrical and/or thermal conductivity of the curable silicone composition (as characterized with the cured product thereof). The MTF may be enhance electrical conductivity but not thermal conductivity of the curable silicone composition, alternatively enhance thermal conductivity but not electrical conductivity of the curable silicone composition, alternatively enhance electrical and thermal conductivities of the curable silicone composition. Examples of the MTF are carbon nanotubes; electrically non-conductive filler particles such as fumed silica, which is thermally conductive; thermally non-conductive filler particles; or a combination of any two or more of the carbon nanotubes and electrically non-conductive filler particles and thermally non-conductive filler particles. In some embodiments the MTF is not carbon fibers, and the curable silicone composition and CSM lack carbon fibers, diamond, graphite, and precrosslinked elastomeric silicone particles. The curable silicone composition and CSM may also lack Al particles. In some embodiments the MTF is carbon nanotubes, alternatively fumed silica, alternatively a combination (e.g., in admixture) of carbon nanotubes and fumed silica. In the curable silicone composition, the MTF, when present, is at a total concentration of from 0.1 to 5 wt %, alternatively from 0.2 to 2 wt %, alternatively from 0.2 to 2.0 wt %, alternatively from 0.5 to 1.5 wt %, alternatively from 0.50 to 1.5 wt %, all based on weight of the curable silicone composition.

In some embodiments the curable silicone composition and CSM lack solder (alloy of two or more metals, at least one metal of which is Bi, Ga, In, or Sn), and the free Ag and Au particles. The curable silicone composition and CSM may also lack Al particles. In some embodiments the curable silicone composition and CSM lack, carbon fibers, diamond, graphite, precrosslinked elastomeric silicone particles, solder, free Ag particles, free Au particles, and free Al particles.

The carbon nanotubes used in the present invention may be single-walled carbon nanotubes; multi-walled carbon nanotubes; derivatized single-walled carbon nanotubes; derivatized multi-walled carbon nanotubes; or a mixture of any two or more of the single-walled carbon nanotubes, multi-walled carbon nanotubes, derivatized single-walled carbon nanotubes, and derivatized multi-walled carbon nanotubes. The carbon nanotubes may be characterizable by an electrical conductivity (K) of ≥1 S/m. The MTF may consist of carbon nanotubes. The "single-walled carbon nanotube" (SWCNT) is an allotrope of carbon having single cylindrical structure (i.e., cylindrical graphene). The "multi-walled carbon nanotubes" (MWCNT) is an allotrope of carbon having multiple sheets of graphite (graphene sheets) in form of coaxial (concentric) cylindrical structures (cylinder within cylinder ("Russian Doll model")) or having a single sheet of graphite (graphene sheet) rolled around itself to form a rolled scroll-like structure ("Parchment model"), or a combination thereof. The CNT may or may not have a "bamboo-like" structure, which may be prepared by chemical vapor deposition pyrolysis of melamine under argon atmosphere at 800° to 980° C. The "derivatized carbon nanotube" is a graphenated carbon nanotube, a functional group-containing carbon nanotube, or a combination structure thereof. The functional group-containing CNT has at least one heteroatom-containing moiety that is covalently bonded to a carbon atom of the carbon nanotube wall wherein the moiety has at least one heteroatom that is O, N, S, P, or halogen (F, Cl, Br, or I). Examples of such functional groups are —$NO_3$, —$SO_3H$, —$PO_3H$, —OH, —COOH, and —$NH_2$. The "graphenated carbon nanotube" is a hybrid structure comprising a graphitic foliate covalently bonded to a sidewall of a SWCNT or MWCNT. The functional group-containing carbon nanotubes may be obtained from a commercial supplier thereof or prepared according to any suitable method. Examples of the suitable method comprise exposing a starting carbon nanotube with a chemical substance, an environmental condition, or any combination thereof so as to install the at least one functional group on a carbon atom of the starting carbon nanotubes to give the functional group-containing carbon nanotubes. The chemical substance may be an aqueous base such as aqueous sodium hydroxide; aqueous acid such as sulfuric acid, nitric acid, or a mixture thereof; an oxidant (e.g., oxygen gas); or a mixture thereof. The environmental condition may be heat treatment (e.g., 900° to 1,100° C. for from 1 to 60 minutes), inert atmosphere, or any combination thereof. graphenated carbon nanotube may be obtained from a commercial supplier thereof or prepared according to any suitable method. Examples of the suitable method comprise any one of the methods of Yu, K., et al. (*Carbon Nanotube with Chemically Bonded Graphene Leaves for Electronic and Optoelectronic Applications*, J. Phys. Chem. Lett., 2011; 13(2): 1556-1562); Stoner, B. R. et al. (*Graphenated carbon nanotubes for enhanced electrochemical double layer capacitor performance, Appl. Phys. Lett., 2011; 99(18):183104-1 to 183104-3); and Hsu, H-C et al. (*Stand-up structure of graphene-like carbon nanowalls on CNT directly grown on polyacrylonitrile-based carbon fiber paper as supercapacitor*, Diamond and Related Materials, 2012; 25:176-179). Examples of the combination structure are —$NO_3$, —$SO_3H$, —$PO_3H$, —OH, —COOH, or —$NH_2$ functionalized graphenated carbon nanotubes such as wherein the —$NO_3$, —$SO_3H$, —$PO_3H$, —OH, —COOH, or —$NH_2$ groups comprise from 0.01 to 5 wt %, alternatively from 0.1 to 3 wt %, alternatively from 0.5 to 2 (e.g., 1 wt %) of the weight of the combination structure. Carbon nanotubes are different from carbon fibers in such a way that the carbon nanotubes have a hollow core whereas carbon fibers have a solid core. Also, carbon fibers and carbon nanotubes have different aspect ratios, i.e., the ratio of average length to average diameter (L/D). The aspect ratio of carbon nanotubes is greater than those of carbon fibers. E.g., the aspect ratio of carbon fibers may be about 100, whereas the aspect ratio of carbon nanotubes may be about 1,000.

Each of the different types of carbon nanotubes particles independently may be characterizable by a maximum outer diameter of 10 µm, alternatively 1 µm, alternatively 500 nm, alternatively 300 nm, alternatively 200 nm, alternatively 100 nm, alternatively 50 nm; and a minimum outer diameter of 1 nm, alternatively 2 nm, alternatively 5 nm, alternatively 8 nm, alternatively 10 nm, alternatively 15 nm, alternatively 25 nm. The carbon nanotubes particles may be characterizable by a maximum length of 1 mm, alternatively 500 µm, alternatively 300 µm, alternatively 150 µm, alternatively 100 µm, alternatively 50 µm, alternatively 25 µm; and a minimum length of 0.1 µm, alternatively 1 µm, alternatively 5 µm., alternatively 10 µm, alternatively 20 µm. Raman spectroscopy, AFM, SEM or TEM may be used to measure the diameter and length.

The carbon nanotubes may be dispersed in the curable organosiloxane composition of the curable silicone composition by any suitable means such as mixing, sonication, or a combination thereof. The concentration of the carbon nanotubes, when present, in the curable silicone composition may be from 0.1 to 5 wt % (e.g., an embodiment of aspect 1 described later), alternatively from 0.1 to 5.0 wt %, alternatively from 0.2 to 2 wt %, alternatively from 0.5 to 1.5 wt %, alternatively from 0.50 to 1.2 wt %, all based on weight of the curable silicone composition. Advantageously, the concentration of the carbon nanotubes, when present, in the curable silicone composition may be varied within the foregoing ranges to adjust rheology such as thixotropic index while beneficially maintaining volume resistivity of the resulting CSM below 0.020 Ohm-cm, alternatively <0.0010 Ohm-cm, or any one of the other aforementioned volume resistivity values; and a thermal conductivity of 2.97 W/(m*K), alternatively >3 W/(m*K), or any one of the aforementioned Thermal Conductivity values while maintaining the total concentration of silver in the attractive range of <15 wt % in the curable silicone composition.

The "electrically conductive metal" means an element of any one of Groups 1 to 13 of the Periodic Table of the Elements plus tin, and lead from Group 14, antimony from Group 15, bismuth from Group 16, and lanthanides and actinides, or a metal alloy of any two or more such elements. The element or metal alloy (e.g., the aforementioned solder) may have a volume resistivity (ρ) at 20° C. less than 0.0001 Ohm-cm and an electrical conductivity (K) at 20° C. greater than $1 \times 10^6$ S/m. Examples of such elements are silver, copper, gold, aluminum, calcium, molybdenum, zinc, bismuth, indium, lithium, tungsten, nickel, iron, palladium, platinum, tin, lead, titanium, mercury, and blends thereof. Examples of such metal alloys are brass (a metal alloy of copper and zinc), bronze (a metal alloy of copper and tin), 67Cu33Zn, carbon steel, grain oriented electrical steel, MANGANIN (trademark name for a metal alloy of formula $Cu_{86}Mn_{12}Ni_2$ by Isabellenhütte Heusler GmbH & Co. KG, Dillenburg, Germany), constantin (a metal alloy of 55% copper and 45% nickel), nichrome, and blends thereof. The curable silicone composition and CSM may lack an electrically conductive metal other than the Cu—Ag core-shell particles.

The "electrically non-conductive filler particles" are finely-divided solids having a volume resistivity (φ at 20° C. greater than 100 Ohm-cm and an electrical conductivity (K) at 20° C. less than 1.0 S/m. The MTF may consist of the electrically non-conductive filler particles. The electrically non-conductive filler particles may be silica glass (e.g., soda-lime-silica glass or borosilicate glass), diamond polymorph of carbon, silica, organic polymer, organosiloxane polymer, or a ceramic. The electrically non-conductive filler particles are distinct from the aforementioned electrically conductive metals. The electrically non-conductive filler particles may be thermally conductive. The curable silicone composition and the CSM may contain thermally conductive fillers that are electrically insulating or electrically non-conductive. Examples of said TC-EI fillers are aluminum nitride, aluminum oxide ($Al_2O_3$), aluminum trihydrate, barium titanate, beryllium oxide, boron nitride (BN), magnesium hydroxide, magnesium oxide, onyx, zinc oxide (ZnO), and a combination of any two or more of said TC-EI fillers.

The electrically non-conductive filler particles may have sufficient size to improve packing of the Cu—Ag core-shell particles in the CSM such that the CSM has lower volume resistivity than that of a comparative CSM having the same concentration of electrically non-conductive filler particles having smaller size. Such sufficient size may be an average particle diameter of the electrically non-conductive filler particles greater than average particle diameter of the silver filler. Spherical silica glass filler particles may beneficially enhance (i.e., decrease) volume resistivity of the resulting CSM compared to that of a CSM prepared from an identical curable silicone composition except lacking the spherical silica glass filler particles. Alternatively or additionally, the spherical silica glass filler particles may beneficially help maintain thickness uniformity of a bondline of the curable silicone composition, CSM, or both, wherein the bondline has been disposed on a substrate such as a substrate for an electrical component, and the resulting component experiences above ambient temperature, pressure, or both (e.g., as during a laminating step). Alternatively or additionally, the spherical silica glass filler particles may beneficially penetrate or mechanically abrade away a metal oxide layer (e.g., copper oxide layer) that may have been formed on an exterior surface of a substrate prone to oxidation or on an exposed surface of the Cu core of the Cu—Ag core-shell particles. An example of the substrate prone to oxidation is a copper foil or wire, a surface layer of which copper may spontaneously oxidize in air to form a copper oxide layer. The curable silicone composition and CSM may lack, alternatively may further comprise, the electrically non-conductive filler particles. In some embodiments the curable silicone composition and CSM lack carbon fibers, solder, diamond, graphite, and silver particles. The concentration of the electrically non-conductive filler particles, when present, may be from 0.01 to 5 wt %, alternatively from 0.1 to 2 wt %, alternatively from 0.1 to 1 wt %, all based on weight of the curable silicone composition.

The electrically non-conductive filler particles may be in the shape of cuboidals, flakes, granules, irregulars, needles, powders, rods, spheres, or a mixture of any two or more of cuboidals, flakes, granules, irregulars, needles, powders, rods, and spheres. The particles may have a median particle size of from 5 to 100 µm. The particles may be characterizable by a maximum particle size of 1 millimeter, alternatively 100 microns (µm), alternatively 50 µm, alternatively 10 µm, alternatively 1 µm, alternatively 500 nanometers (nm). Particle size may be measured as described before for measuring Cu—Ag core-shell particle size.

The "curable organosiloxane composition" may be any curable organosiloxane such as a condensation curable organosiloxane, free radical curable organosiloxane, or hydrosilylation-curable organosiloxane. The "silicone" includes linear and branched organosiloxanes. The main advantages of the present invention may be achieved with embodiments employing any curable organosiloxane.

Depending on its reactive functional groups, curing or rate of curing of the curable organosiloxane composition may be enhanced by contacting the curable organosiloxane composition with a metal-containing catalyst, heat, ultraviolet (UV) light, $O_2$, peroxides, water (e.g., water vapor in air), or a combination thereof. The metal of the metal-containing catalyst may be Sn, Ti, Pt, or Rh. The condensation curable organosiloxane may be hydroxy-functionalized and/or alkoxy-functionalized. Curing or curing rate of the condensation curable organosiloxane may be enhanced by moisture, heat, or heat and moisture. The free radical curable organosiloxane may be alkenyl-functionalized (e.g., vinyl) and/or alkynyl-functionalized. Curing or curing rate of the free radical curable organosiloxane may be enhanced by UV light or peroxides, heat, or both. The hydrosilylation-curable organosiloxane may be alkenyl functionalized (e.g., vinyl) and Si—H functionalized. Curing or curing rate of the hydrosilylation-curable organosiloxane may be enhanced by a hydrosilylation catalyst (e.g., a Pt catalyst), heat, or both hydrosilylation catalyst and heat. Enhancing curing or rate of curing may comprise increasing extent or degree of curing or increasing the rate of curing at a given temperature or decreasing the temperature at which a given rate of curing is achieved.

Each organosiloxane molecule comprises silicon, carbon, hydrogen, and oxygen atoms. As used in "organosiloxane" the term "organo" means a hydrocarbyl, heterohydrocarbyl, or organoheteryl, which groups are collectively referred to herein as organogroups. Each organogroup may be heterohydrocarbyl, alternatively organoheteryl, alternatively hydrocarbyl. The hydrocarbyl, heterohydrocarbyl, and organoheteryl groups are described later. Each organogroup may have from 1 to 20 carbon atoms, e.g., a ($C_1$-$C_{20}$) hydrocarbyl. Each organosiloxane molecule may contain only unsubstituted hydrocarbyl groups (i.e., contain only silicon, carbon, hydrogen atoms bonded to carbon atoms, and oxygen atoms). Alternatively, one or more organosiloxane molecules may be substituted with heterohydrocarbyl, organoheteryl, or a reactive functional group. Each reactive functional group independently may be the alkenyl or alkynyl moiety; Si—H moiety; Si—OH moiety; Si—$OR^X$ moiety, wherein $R^X$ is ($C_1$-$C_{10}$)hydrocarbyl, —C(O)($C_1$-$C_{10}$)hydrocarbyl; or —N=$CR^1R^2$ moiety, wherein each of $R^1$ and $R^2$ independently is ($C_1$-$C_{10}$)hydrocarbyl or $R^1$ and $R^2$ are taken together to form a ($C_2$-$C_{10}$)hydrocarbylene.

Each organosiloxane molecule independently may comprise a silicon-containing base polymer having a linear, branched, cyclic, or resinous structure. For example, each silicon-containing base polymer independently may have a linear structure, alternatively a branched structure, alternatively a cyclic structure, alternatively a resinous structure. Each silicon-containing base polymer independently may be a homopolymer or copolymer. Each silicon-containing base polymer independently may have one or more of the reactive functional groups per molecule. At least some, alternatively most, alternatively substantially all reactive functional groups react during curing of the curable organosiloxane composition to give the cured organosiloxane. The reactive functional groups independently may be located on the silicon-containing base polymer at terminal, pendant, or terminal and pendant positions. Each organosiloxane molecule of the curable organosiloxane composition may be a single silicon-containing base polymer, alternatively may comprise two or more silicon-containing base polymers differing from each other in at least one of the following properties: structure, viscosity, average molecular weight, siloxane units, and unit sequence.

The condensation curable organosiloxane may be a diorganosiloxane compound having on average per molecule at least 1 hydroxyl moiety, or a mixture of the diorganosiloxane compound and an organohalogensilicon compound having on average per molecule at least one halogen atom (e.g., Cl, F, Br, or I). Alternatively, the condensation curable organosiloxane may be a mixture of the component (A) and component (B) described in U.S. Pat. No. 6,534,581 B1, at column 3, line 3, to column 4, line 63. (Components (A) and (B) are different than ingredients (A) and (B) described later herein.) The present invention, however, is not limited to this condensation curable organosiloxane.

As used in "diorganosiloxane compound" (whether condensation curable or not) the term "diorgano" means a molecule having at least one difunctional (D) unit of formula $R_2SiO_{2/2}$; wherein each R independently is an organogroup. Examples of diorganosiloxane compounds are a polydimethylsiloxane, wherein each organo group of the D units is methyl; poly(ethyl,methyl)siloxane wherein the organo groups of the D units are methyl and ethyl groups as in the D unit of formula $CH_3(CH_3CH_2)SiO_{2/2}$; and poly(methyl, phenyl)siloxane wherein the organo groups of the D units are methyl and phenyl groups as in the D unit of formula $CH_3(C_6H_5)SiO_{2/2}$. The diorganosiloxane compound may have all D units as in a diorganocyclosiloxane compound. Typically, the diorganosiloxane compound further has at least one M, Q, and/or T units. The reactive functional group(s) may be on any one or more of the D units and/or one or more of any M and/or Q units.

The condensation curable organosiloxane may be a diorganosiloxane compound having on average per molecule at least 1 alkenyl moiety. Alternatively, the free radical curable organosiloxane may be the oligomer, polymer, or product of curing the polymerizable monomer described in U.S. Pat. No. 7,850,870 B2, at column 5, line 28, to column 12, line 9. The present invention, however, is not limited to this free radical curable organosiloxane.

Typically, the curable silicone composition and its curable organosiloxane composition comprises the hydrosilylation-curable organosiloxane and after curing the CSM comprises an at least partially hydrosilylation cured organosiloxane. The present invention, however, is not limited to using hydrosilylation-curable/cured organosiloxanes.

Before at least partial curing, a first embodiment of the hydrosilylation-curable organosiloxane typically comprises ingredients (A) and (C) when ingredient (A) contains a Si—H moiety. Alternatively a second embodiment of the hydrosilylation-curable organosiloxane typically comprises ingredients (A), (B) and (C) when ingredient (A) contains or lacks a Si—H moiety. Ingredients (A) to (C) are: (A) at least one diorganosiloxane compound having an average of at least one unsaturated carbon-carbon bonds per molecule; (B) an organohydrogensilicon compound having an average of at least one Si—H moieties per molecule; and (C) a hydrosilylation catalyst. Ingredient (B) may function as a chain extender or crosslinker for extending or crosslinking ingredient (A).

As used in "organohydrogensilicon compound" (whether hydrosilylation curable or not) the term "organohydrogen" means a molecule having at least one difunctional unit of formula RHSi, wherein R independently is an organogroup. When the organohydrogensilicon compound is an organohydrogensiloxane compound, the molecule has the difunctional (D) unit of formula $RHSiO_{2/2}$; wherein R independently is an organogroup.

During hydrosilylation curing, different molecules of ingredient (A) in the first embodiment, or ingredients (A) and (B) in the second embodiment, react together via hydrosilylation to give the at least partially hydrosilylation cured organosiloxane. The reaction may give substantial curing; alternatively complete curing. The hydrosilylation cured organosiloxane may be substantially cured, alternatively completely cured. Substantially cured means a degree of curing that is at least 90 mole %, alternatively at least 95 mole %, alternatively at least 98 mole % cured based on the limiting ingredient. The degree of curing may be determined by Differential Scanning calorimetry (DSC). A fully cured material would not show an exotherm peak by DSC analysis when a sample of the fully cured material is heated during the DSC measurement. An uncured material that is capable of curing would show an exotherm peak (e.g., indicative of an exothermic event such as a reaction or mixing that generates or releases heat) having a maximum area for the uncured material by DSC analysis when a sample of the uncured material is heated during the DSC measurement. A partially cured material would show an exotherm peak wherein the area thereof would be intermediate between the area of the exotherm peak for the uncured material and the 0 area (no exotherm peak) for the cured material. The proportion of area of the exotherm peak of the partially cured material compared to the area of the exotherm peak of the uncured material would be proportional to the percent curing of the partially cured material. Each diorganosiloxane compound and organohydrogensilicon compound independently may be the same (i.e., have both Si—H and unsaturated carbon-carbon bonds in same molecule), alternatively different. When ingredients (A) and (B) are the same compound, the curing comprises intermolecular hydrosilylations and may also comprise intramolecular hydrosilylations. When ingredients (A) and (B) are different compounds, the curing comprises intermolecular hydrosilylations.

Ingredient (A), the at least one diorganosiloxane compound, is hydrosilylation-curable and may include a single diorganosiloxane compound, or a plurality of different diorganosiloxane compounds. As suggested in the foregoing paragraph, each diorganosiloxane compound may contain, alternatively lack a Si—H moiety. Each diorganosiloxane compound independently may have an average of at least 1, alternatively >1, alternatively ≥2, alternatively ≥3, alternatively ≥5, alternatively ≥10 unsaturated carbon-carbon bonds per molecule. Each unsaturated carbon-carbon bond independently is C═C (alkenyl) or C≡C (alkynyl). Typically at least one of the unsaturated carbon-carbon bonds is C═C, alternatively all of the unsaturated carbon-carbon bonds are C═C, alternatively at least one of the unsaturated carbon-carbon bonds is C≡C, alternatively all are C≡C, alternatively the unsaturated carbon-carbon bonds are a combination of C═C and C≡C. The diorganosiloxane compound may be an alkynyl siloxane or alkenyl siloxane wherein there are at least one alkynyl or alkenyl groups, respectively, and each of the alkynyl or alkenyl groups may be pending from a carbon, oxygen, or silicon atom. Each alkenyl group independently may have one or more C═C bonds. Each alkenyl may have one C═C and be a ($C_2$-$C_6$) alkenyl, alternatively ($C_2$-$C_4$)alkenyl (e.g., vinyl or allyl). The C═C bond in the alkenyl may be internal as in 5-hexen-1-yl or terminal alkenyl as in $H_2C$═C(H)—($C_0$-$C_6$)alkylene ($H_2C$═C(H)—($C_0$)alkylene is vinyl). The alkynyl and alkenyl groups independently may be located at any interval and/or location in the diorganosiloxane compound such as terminal, pendant, or both terminal and pendant (internal) positions. The diorganosiloxane compound(s) may be a mixture or blend of at least two different diorganosiloxane compounds, so long as ingredient (A) has the average of at least one unsaturated carbon-carbon bonds per molecule. The diorganosiloxane compound may be a diorganocyclosiloxane monomer or a polydiorganosiloxane.

Referring again to ingredient (A), the polydiorganosiloxane may be straight or branched, uncrosslinked or crosslinked and comprise at least two D units. Any polydiorganosiloxane may further comprise additional D units. Any polydiorganosiloxane may further comprise at least one M, T, or Q unit in any covalent combination; alternatively at least one M unit; alternatively at least one T unit; alternatively at least one Q unit; alternatively any covalent combination of at least one M unit and at least one T unit. The polydiorganosiloxane with the covalent combination may be a DT, MT, MDM, MDT, DTQ, MTQ, MDTQ, DQ, MQ, DTQ, or MDQ polydiorganosiloxane. Ingredient (A) may be a mixture or blend of polydiorganosiloxanes, e.g., a mixture of MDM and DT molecules. Known symbols M, D, T, and Q, represent the different functionality of structural units that may be present in a siloxane (e.g., a silicone), which comprises siloxane units joined by covalent bonds. The monofunctional (M) unit represents $R_3SiO_{1/2}$; the difunctional (D) unit represents $R_2SiO_{2/2}$; the trifunctional (T) unit represents $R_3SiO_{3/2}$ and results in the formation of branched linear siloxanes; and the tetrafunctional (Q) unit represents $SiO_{4/2}$ and results in the formation of crosslinked and resinous compositions. The reactive group-functional siloxane may be $R^1SiO_{3/2}$ units (i.e., T units) and/or $SiO_{4/2}$ units (i.e., Q units) in covalent combination with $R^1R^4_2SiO_{1/2}$ units (i.e., M units) and/or $R^4_2SiO_{2/2}$ units (i.e., D units). Each "R" group, e.g., R, $R^1$ and $R^4$ independently is hydrocarbyl, heterohydrocarbyl, or organoheteryl, which are collectively referred to herein as organogroups. Each hydrocarbyl, heterohydrocarbyl, and organoheteryl independently may have from 1 to 20, alternatively from 1 to 10, alternatively from 1 to 8, alternatively from 1 to 6 carbon atoms. Each heterohydrocarbyl and organoheteryl independently comprises carbon, hydrogen and at least one heteroatom that independently may be halo, N, O, S, or P; alternatively S; alternatively P; alternatively halo, N, or O; alternatively halo; alternatively halo; alternatively O; alternatively N. Each heterohydrocarbyl and organoheteryl independently may have up to 4, alternatively from 1 to 3, alternatively 1 or 2, alternatively 3, alternatively 2, alternatively 1 heteroatom(s). Each halohydrocarbyl independently may be halohydrocarbyl (e.g., fluoromethyl, trifluoromethyl, trifluorovinyl, or chlorovinyl), alternatively aminohydrocarbyl (e.g., $H_2N$-hydrocarbyl) or alkylaminohydrocarbyl, alternatively dialkylaminohydrocarbyl (e.g., 3-dimethylaminopropyl), alternatively hydroxyhydrocarbyl, alternatively alkoxyhydrocarbyl (e.g., methoxyphenyl). Each organoheteryl independently may be hydrocarbyl-N(H)—, (hydrocarbyl)$_2$N—, hydrocarbyl-P(H)—, (hydrocarbyl)$_2$P—, hydrocarbyl-O—, hydrocarbyl-S—, hydrocarbyl-S(O)—, or hydrocarbyl-S(O)$_2$—. Each hydrocarbyl independently may be (C$_1$-C$_8$)hydrocarbyl, alternatively (C$_1$-C$_6$)hydrocarbyl, alternatively (C$_1$-C$_3$)hydrocarbyl, alternatively (C$_1$-C$_2$)hydrocarbyl. Each (C$_1$-C$_8$)hydrocarbyl independently may be (C$_7$-C$_8$)hydrocarbyl, alternatively (C$_1$-C$_6$)hydrocarbyl. Each (C$_7$-C$_8$)hydrocarbyl may be a heptyl, alternatively an octyl, alternatively benzyl, alternatively tolyl, alternatively xylyl. Each (C$_1$-C$_6$)hydrocarbyl independently may be (C$_1$-C$_6$)alkyl, (C$_2$-C$_6$)alkenyl, (C$_2$-C$_6$)alkynyl, (C$_3$-C$_6$)cycloalkyl, or phenyl. Each (C$_1$-C$_6$)alkyl independently may be methyl, ethyl, propyl, butyl, or pentyl; alternatively methyl or ethyl; alternatively methyl; alternatively ethyl. Each halo independently may be bromo, fluoro or chloro; alternatively bromo; alternatively fluoro; alternatively chloro. Each R, R$^1$ and R$^4$ independently may be hydrocarbyl; alternatively halohydrocarbyl; alternatively hydrocarbyl and at least one heterohydrocarbyl; alternatively hydrocarbyl and at least one organoheteryl. There may be an average of at least 1 "R" per molecule having an alkenyl or alkynyl group capable of undergoing hydrosilylation. For example, there may be an average of at most 4, alternatively at least 1, alternatively >1, alternatively at least 2, alternatively 3, alternatively from 1 to 4, alternatively from 1 to 3 alkenyl or alkynyl group per diorganosiloxane molecule each independently capable of undergoing hydrosilylation. Examples of suitable alkenyl are vinyl, fluorovinyl, trifluorovinyl, allyl, 4-buten-1-yl, and 1-buten-4-yl. Examples of suitable alkynyl are acetylenyl, propyn-3-yl, and 1-butyn-4-yl.

Referring again to ingredient (A), the polydiorganosiloxane may be a polydialkylsiloxane, e.g., an alkyldialkenylsiloxy-terminated polydialkylsiloxane or a dialkylalkenylsiloxy-terminated polydialkylsiloxane, e.g., a dialkylvinylsiloxy-terminated polydialkylsiloxane. Examples of the dialkylvinylsiloxy-terminated polydialkylsiloxane are dimethylvinylsiloxy-terminated polydimethylsiloxane; diethylvinylsiloxy-terminated polydimethylsiloxane; methyldivinylsiloxy-terminated polydimethylsiloxane; dimethylvinylsiloxy-terminated polydiethylsiloxane; dimethylvinylsiloxy-terminated poly(methyl,ethyl)siloxane; poly(methyl,(C$_7$-C$_8$)hydrocarbyl)siloxane; and combinations thereof. Alternatively, the polydiorganosiloxane may be a hydroxy-terminated polydiorganosiloxane. The hydroxy-terminated polydiorganosiloxane may be a hydroxy-terminated polydialkylsiloxane having pendent alkenyl, alkynl, or alkenyl and alkenyl groups. Examples of the hydroxy-terminated polydialkylsiloxane are hydroxy-terminated polydimethylsiloxane having pendent vinyl groups; hydroxy-terminated polydiethylsiloxane having pendent vinyl groups; hydroxy-terminated poly(methyl,ethyl)siloxane having pendent vinyl groups; hydroxy-terminated poly(methyl,(C$_7$-C$_8$)hydrocarbyl)siloxane having pendent vinyl groups; and combinations thereof. Terminated means mono (alpha), alternatively bis (both alpha and omega) termination. Alternatively, any one of the foregoing polydialkylsiloxanes may further comprise one or more (e.g., from 1 to 3) internal (alkyl,alkynyl) units, alternatively internal (alkyl,alkenyl) units (e.g., methyl,vinyl or ethyl, vinyl units) or one or more (e.g., from 1 to 3) alkenyl-containing pendent groups, e.g., a dimethylvinylsiloxy-pendent group-containing polydimethylsiloxane. Alternatively, the polydiorganosiloxane may be an alkenyldialkylsilyl end-blocked polydialkylsiloxane; alternatively a vinyldimethylsilyl end-blocked polydimethylsiloxane. Ingredient (A) may be a polydiorganosiloxane comprising methyl and vinyl R groups. Ingredient (A) may be a poly(methyl,vinyl)siloxane (homopolymer); alternatively a hydroxy-terminated poly (methyl,vinyl)siloxane (homopolymer); alternatively a poly (methyl,vinyl)(dimethyl)siloxane copolymer; alternatively a hydroxy-terminated poly(methyl,vinyl)(dimethyl)siloxane copolymer; alternatively a mixture of any of at least two thereof. A poly(methyl,vinyl)(dimethyl)siloxane copolymer means a molecule having R$^1$,R$^4$SiO$_{2/2}$ units wherein R$^1$ is methyl and R$^4$ is vinyl and R$^1$,R$^1$SiO$_{2/2}$ units wherein each R$^1$ is methyl.

Referring again to ingredient (A), the diorganocyclosiloxane monomer may be a (R$^1$,R$^4$)cyclosiloxane, wherein R$^1$ and R$^4$ independently are as defined previously. The (R$^1$,R$^4$)cyclosiloxane may be a (C$_7$-C$_8$)hydrocarbyl,alkenyl-cyclosiloxane, (C$_7$-C$_8$)hydrocarbyl,alkynyl-cyclosiloxane, alkyl,alkynyl-cyclosiloxane, or a alkyl,alkenyl-cyclosiloxane, wherein (C$_7$-C$_8$)hydrocarbyl and alkyl independently are as defined previously. The (alkyl,alkenyl)-cyclosiloxane may be, e.g., a (alkyl,vinyl)-cyclosiloxane, e.g., a methyl, vinyl-cyclosiloxane or (ethyl,vinyl)-cyclosiloxane.

Referring again to ingredient (A), the diorganosiloxane compound may further comprise, alternatively may substantially lack volatile diorganosiloxanes. Reiterated, the diorganosiloxane compound may be used as prepared, with volatile diorganosiloxane components retained; alternatively the as prepared diorganosiloxane compound may be devolatilized to remove a volatile fraction before use in the curable organosiloxane composition.

Referring again to ingredient (A), the diorganosiloxane compound may have a number-average molecular weight (M$_n$) of from 500 to 50,000 g/mol, alternatively from 500 to 10,000 g/mol, alternatively 1,000 to 3,000, g/mol, where the M$_n$ is determined by gel permeation chromatography employing a low angle laser light scattering detector, or a refractive index detector and silicone resin (MQ) standards. The diorganosiloxane compound may have a dynamic viscosity of from 0.01 to 100,000 Pascal-seconds (Pa·s), alternatively from 0.1 to 99,000 Pa·s, alternatively from 1 to 95,000 Pa·s, alternatively from 10 to 90,000 Pa·s, alternatively from 100 to 89,000 Pa·s, alternatively from 1,000 to 85,000 Pa·s, alternatively from 10,000 to 80,000 Pa·s, alternatively from 30,000 to 60,000 Pa·s., alternatively from 40,000 to 75,000 Pa·s., alternatively from 40,000 to 70,000 Pa·s., alternatively from 10,000 to <40,000 Pa·s, alternatively from 5,000 to 15,000 Pa·s, alternatively from >75,000 to 100,000 Pa·s. The dynamic viscosity is measured at 25° C. according to the dynamic viscosity test method described later. The diorganosiloxane compound may have less than 10 wt %, alternatively less than 5 wt %, alternatively less than 2 wt %, of silicon-bonded hydroxyl groups, as determined by $^{29}$Si-NMR. Alternatively, the diorganosiloxane compound may have less than 10 mole percent (mol %), alternatively less than 5 mol %, alternatively less than 2 mol %, of silicon-bonded hydroxyl groups, as determined by $^{29}$Si-NMR.

The ingredient (A) (e.g., the diorganosiloxane compound) may be from 1 to 39 wt %, alternatively from 3 to 30 wt %, alternatively from 4 to 20 wt % of the curable silicone composition. Alternatively, the ingredient (A) may be from 50 to 90 wt %, alternatively from 60 to 80 wt %, alternatively from 70 to 80 wt % of the hydrosilylation-curable organosiloxane.

Ingredient (B), the organohydrogensilicon compound, has at least one silicon-bonded hydrogen atom per molecule.

The organohydrogensilicon compound may be a single organohydrogensilicon compound, or a plurality of different organohydrogensilicon compounds. The organohydrogensilicon compound may have organo groups and an average of at least two, alternatively at least three silicon-bonded hydrogen atoms per molecule. Each organo group independently may be the same as R, $R^1$, or $R^4$ groups as defined before. The organohydrogensilicon compound may be an organohydrogensilane, an organohydrogensiloxane, or a combination thereof. The structure of the organohydrogensilicon compound may be linear, branched, cyclic (e.g., Cyclosilanes and cyclosiloxanes), or resinous. Cyclosilanes and cyclosiloxanes may have from 3 to 12, alternatively from 3 to 10, alternatively 3 or 4 silicon atoms. In acyclic polysilanes and polysiloxanes, the silicon-bonded hydrogen atoms may be located at terminal, pendant, or at both terminal and pendant positions.

Referring to an embodiment of ingredient (B), the organohydrogensilane may be a monosilane, disilane, trisilane, or polysilane (tetra- or higher silane). Examples of suitable organohydrogensilanes are diphenylsilane, 2-chloroethylsilane, bis[(p-dimethylsilyl)phenyl]ether, 1,4-dimethyldisilylethane, 1,3,5-tris(dimethylsilyl)benzene, 1,3,5-trimethyl-1,3,5-trisilane, poly(methylsilylene)phenylene, and poly(methylsilylene)methylene.

Referring to an embodiment of ingredient (B), the organohydrogensiloxane may be a disiloxane, trisiloxane, or polysiloxane (tetra- or higher siloxane). The organohydrogensiloxane may be further defined as an organohydrogenpolysiloxane resin, so long as the resin includes at least one silicon-bonded hydrogen atom per molecule. The organohydrogenpolysiloxane resin may be a copolymer including T units, and/or Q units, in combination with M units, and/or D units, wherein T, Q, M and D are as described above. For example, the organohydrogenpolysiloxane resin can be a DT resin, an MT resin, an MDT resin, a DTQ resin, an MTQ resin, an MDTQ resin, a DQ resin, an MQ resin, a DTQ resin, an MTQ resin, or an MDQ resin. The M, D, T and Q units may be the same as those described previously. Examples of suitable organohydrogensiloxanes are 1,1,3,3-tetramethyldisiloxane, 1,1,3,3-tetraphenyldisiloxane, phenyltris(dimethylsiloxy)silane, 1,3,5-trimethylcyclotrisiloxane, a trim ethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a (H,Me)Si resin. Thus, the organohydrogensilicon compound may be the trimethylsiloxy-terminated poly(dimethylsiloxane/methylhydrogensiloxane).

Referring again to ingredient (B), the organohydrogensilicon compound may have a molecular weight less than 1,000, alternatively less than 750, alternatively less than 500 g/mol. The organohydrogensilicon compound may be a dimethylhydrogensilyl terminated polydimethylsiloxane; alternatively a trialkylsilyl terminated polydialkylsiloxane-alkylhydrogensiloxane co-polymer; alternatively a trimethylsilyl terminated polydimethylsiloxane-methylhydrogensiloxane co polymer; alternatively a mixture of a dialkylhydrogensilyl terminated polydialkylsiloxane and a trialkylsilyl terminated polydialkylsiloxane-alkylhydrogensiloxane co-polymer. The dialkylhydrogensilyl terminated polydialkylsiloxane may be a dimethylhydrogensilyl terminated polydimethylsiloxane. The trialkylsilyl terminated polydialkylsiloxane-alkylhydrogensiloxane co-polymer may be a trimethylsilyl terminated polydimethylsiloxane-methylhydrogensiloxane co-polymer.

The ingredient (B) (e.g., the organohydrogensilicon compound) may be from 0.1 to 10 wt %, alternatively from 0.2 to 8 wt %, alternatively from 0.3 to 5 wt % of the curable silicone composition. Alternatively, the ingredient (B) may be from 1 to 10 wt %, alternatively from 2 to 8 wt %, alternatively from 3 to 7 wt % of the hydrosilylation-curable organosiloxane.

Referring again to ingredients (A) and (B), the hydrosilylation-curable organosiloxane may have a molar ratio of total silicon-bonded hydrogen atoms to unsaturated carbon-carbon bonds of from 0.05 to 100, alternatively from 0.1 to 100, alternatively from 0.05 to 20, alternatively from 0.5 to 15, alternatively from 1.5 to 14. When ingredients (A) and (B) are different molecules, the hydrosilylation-curable organosiloxane may have a molar ratio of silicon-bonded hydrogen atoms per molecule of the organohydrogensilicon compound to unsaturated carbon-carbon bonds per molecule of the diorganosiloxane compound of from 0.05 to 100, alternatively from 0.1 to 100, alternatively from 0.05 to 20, alternatively from 0.5 to 14, alternatively from 0.5 to 2, alternatively from 1.5 to 5, alternatively from >5 to 14. The present invention, however, is not limited to the hydrosilylation-curable organosiloxane comprising ingredients (A) and (B).

Ingredient (C), the hydrosilylation catalyst, is any compound or material useful to accelerate a hydrosilylation reaction between the diorganosiloxane compound and the organohydrogensilicon compound. The hydrosilylation catalyst may comprise a metal; a compound containing the metal; or any combination thereof. Each metal independently be platinum, rhodium, ruthenium, palladium, osmium, or iridium, or any combination of at least two thereof. Typically, the metal is platinum, based on its high activity in hydrosilylation reactions. Typically ingredient (C) is the platinum compound. Examples of suitable platinum hydrosilylation catalysts are complexes of chloroplatinic acid and certain vinyl-containing organosiloxanes in U.S. Pat. No. 3,419,593 such as the reaction product of chloroplatinic acid and I,3-diethenyl-I,I,3,3-tetramethyldisiloxane. The hydrosilylation catalyst may be unsupported or disposed on a solid support (e.g., carbon, silica, or alumina). The hydrosilylation catalyst may be microencapsulated in a thermoplastic resin for increased stability during storage of the curable silicone composition comprising the hydrosilylation-curable organosiloxane before curing. When curing is desired, the microencapsulated catalyst (e.g., see U.S. Pat. No. 4,766,176 and U.S. Pat. No. 5,017,654) may be heated about the melting or softening point of the thermoplastic resin, thereby exposing the hydrosilylation catalyst to ingredients (A) and (B). The hydrosilylation catalyst may be a photoactivatable catalyst (e.g., platinum(II) β-diketonate complexes such as platinum(II) bis(2,4-pentanedionate)) for increased stability during storage of the curable silicone composition before curing. When curing is desired, the photoactivatable catalyst may be exposed to ultraviolet radiation having a wavelength of from 150 to 800 nanometers (nm), thereby activating the catalyst to the hydrosilylation reaction of ingredients (A) and (B).

Ingredient (C) typically is employed in a catalytically effective amount. The catalytically effective amount of the hydrosilylation catalyst is any quantity sufficient to catalyze, increase the rate of hydrosilylation of the diorganosiloxane compound and organohydrogensilicon compound. A suitable concentration of the unsupported and unencapsulated hydrosilylation catalyst in the hydrosilylation-curable organosiloxane is from 0.1 to 1000 parts per million (ppm), alternatively from 1 to 500 ppm, alternatively from 3 to 150 ppm, alternatively from 1 to 25 ppm, based on the combined weight of ingredients (A) to (C). A suitable concentration of the microencapsulated hydrosilylation catalyst in the hydrosilylation-curable organosiloxane is from 1 to 20 wt %, alternatively from 3 to 17 wt %, alternatively from 5 to 15 wt %, alternatively from 10 to 15 wt %, all based on the combined weight of ingredients (A) to (C).

The curable organosiloxane composition (e.g., ingredients (A) to (C)) may be from 7 to 25 wt %, alternatively from 7.0 to 20 wt %, alternatively from 8 to 16 wt %, all based on the weight of the curable silicone composition. Alternatively, especially for the curable silicone composition having improved thermal conductivity (i.e., being curable to an embodiment of the CSM having improved thermal conductivity), the curable organosiloxane composition (e.g., ingredients (A) to (C)) may be from 8 to 16 wt %, alternatively from 8 to 15.4 wt %, alternatively from 8 to 15.0 wt %, alternatively from 8 to 14 wt %, alternatively from >8 to <14 wt %, alternatively from 9 to 13 wt %, all based on the weight of the curable silicone composition.

Optional ingredients. As described earlier, the curable silicone composition comprises the following original ingredients: the hydrocarbon vehicle, curable organosiloxane composition, and the Cu—Ag core-shell particles. In some embodiments the curable silicone composition and CSM lack additional ingredients. The term "lack" means contains less than the minimum concentration of; alternatively is completely free of, does not contain (e.g., contains 0.000 wt % of), or does not include any. However, whether curable by hydrosilylation, condensation, free radical, or other chemistry, it may be desirable for the curable silicone composition and CSM to further comprise at least one additional ingredient that is distinct from the original ingredients. The at least one additional ingredient should not affect the basic and novel characteristics of the present invention, e.g., achieving one or more of the advantages described herein for the curable silicone composition and CSM.

In some embodiments the curable silicone composition and CSM further comprise the at least one additional ingredient. The amount of the at least one additional ingredient, when present in the curable silicone composition, or the curable silicone composition and CSM prepared therefrom, is not so high as to prevent the curable silicone composition from satisfying at least the minimum concentrations of the original ingredients or prevent the CSM from satisfying its limitations such as volume resistivity, total silver concentration, and other functions and concentrations as described herein. When present in the curable silicone composition, the at least one additional ingredient may be at a total concentration of 0.01 to 5 wt % based on weight of the curable silicone composition. When present, the total concentration of all the additional ingredients is from 0.1 to 2 wt %, alternatively from 0.1 to 1 wt %.

The curable silicone composition may be prepared with the at least one additional ingredient in any suitable manner. For example, the at least one additional ingredient may be premixed with the curable organosiloxane composition or a diorganosiloxane ingredient thereof. The resulting premixture may then be blended with the hydrocarbon vehicle, any other ingredients of the curable organosiloxane composition, and conductive filler to prepare embodiments of the curable silicone composition wherein the blend further comprises the at least one additional ingredient.

Typically, the at least one additional ingredient includes the MTF, alternatively an adhesion promoter (preferably said adhesion promoter being present when the curable silicone composition and the CSM is used as an adhesive), more typically an organosiloxane adhesion promoter, alternatively the carbon nanotubes and the organosiloxane adhesion promoter. Alternatively or additionally, the at least one additional ingredient may be one or more of a silicone extender, organic plasticizer, or a combination of silicone extender and organic plasticizer; a curing inhibitor (e.g., a hydrosilylation reaction inhibitor when the curable silicone composition is a hydrosilylation curable silicone composition); a defoamer; a biocide; a chain lengthener; a chain endblocker; an anti-aging additive; an acid acceptor; and a combination of any two or more selected from the immediately foregoing listing (i.e., the listing from the silicone extender to the acid acceptor). Alternatively, the at least one additional ingredient may be a combination of the adhesion promoter and any one or more selected from the immediately foregoing listing from the silicone extender to the acid acceptor. For example, the adhesion promoter may be used in combination with the silicone extender, hydrosilylation reaction inhibitor, or both. The at least one additional ingredient may be the adhesion promoter, alternatively the silicone extender, alternatively the organic plasticizer, alternatively the combination of silicone extender and organic plasticizer, alternatively the curing inhibitor, alternatively the defoamer, alternatively the biocide, alternatively the chain lengthener, alternatively the chain endblocker, alternatively the anti-aging additive, alternatively the acid acceptor, alternatively any one of the combinations. Additionally, it is convenient to name optional ingredients by an intended use of the optional ingredient in the curable silicone composition and/or CSM. The intended use, however is not limiting of the chemistry of the so-named optional ingredient and does not restrict how the so-named optional ingredient may react or function during curing of the curable silicone composition to give the CSM. To illustrate, a so-called adhesion promoter may function in the curable silicone composition and/or CSM as an adhesion promoter and optionally as a chain lengthener, crosslinker, silicone extender, or any combination of adhesion promoter and one or more of chain lengthener, crosslinker and silicone extender. The ingredients of the curable silicone composition and CSM may be chemically compatible with the Cu—Ag core-shell particles such that oxidation of the Cu(0) cores is inhibited or prevented.

The adhesion promoters useful in the present invention may comprise a metal chelate, a silicon-based adhesion promoter, or a combination of any two or more thereof. The combination may be a combination of the metal chelate and at least one silicon-based adhesion promoter or a combination of at least two different silicon-based adhesion promoters. The different silicon-based adhesion promoters differ from each other in at least one of the following properties: structure, viscosity, average molecular weight, siloxane units, and unit sequence. Further, the silicon-based adhesion promoters differ from other silicon-based ingredients of the curable organosiloxane composition (e.g., ingredients (A) and (B) of the embodiment(s) of the hydrosilylation-curable organosiloxane) in at least one of the following properties: structure, viscosity, average molecular weight, siloxane units, and unit sequence. In some embodiments the curable silicone composition and CSM lack the adhesion promoter; in other embodiments they further comprise the adhesion promoter.

The metal chelate adhesion promoter may be based on a metal that is lead, tin, zirconium, antimony, zinc, chromium, cobalt, nickel, aluminum, gallium, germanium, or titanium. The metal chelate may comprise the metal cation and an anionic chelating ligand such as a monocarboxylate, dicarboxylate, or alkoxide. The adhesion promoter may comprise a non-transition metal chelate such as an aluminum chelate such as aluminum acetylacetonate. Alternatively, the metal chelate may be a transition metal chelate. Suitable transition metal chelates include titanates, zirconates such as zirconium acetylacetonate, and combinations thereof. The metal chelate may be the titanium chelate. Alternatively, the adhesion promoter may comprise a combination of a metal chelate with an alkoxysilane, such as a combination of glycidoxypropyltrimethoxysilane with an aluminum chelate or a zirconium chelate. Alternatively, the metal chelate may lack silicon. Example of suitable metal chelates are mentioned in U.S. Pat. No. 4,680,364 at column 3, line 65, to column 6, line 59.

Typically, the adhesion promoter is the silicon-based adhesion promoter. Suitable silicon-based adhesion promoters include a hydrocarbyloxysilane, a combination of an alkoxysilane and a hydroxy-functional polyorganosiloxane, an aminofunctional silane, or a combination of any two or more thereof. The hydrocarbyloxysilane may be an alkoxysilane.

For example, the adhesion promoter may comprise a silane having the formula $R^{19}_r R^{20}_s Si(OR^{21})_{4-(r+s)}$ where each $R^{19}$ is independently a monovalent organic group having at least 3 carbon atoms; $R^{20}$ contains at least one Si—C-substituent wherein the substituent has an adhesion-promoting group, such as amino, epoxy, mercapto or acrylate groups; each $R^{21}$ is independently a saturated hydrocarbon group; subscript r has a value ranging from 0 to 2; subscript s is either 1 or 2; and the sum of (r+s) is not greater than 3. Saturated hydrocarbon groups for $R^{21}$ may be an alkyl group of 1 to 4 carbon atoms, alternatively alkyl of 1 or 2 carbon atoms. $R^{21}$ may be methyl, ethyl, propyl, or butyl; alternatively $R^{21}$ may be methyl. Alternatively, the adhesion promoter may comprise a partial condensate of the above silane. Alternatively, the adhesion promoter may comprise a combination of an alkoxysilane and a hydroxy-functional polyorganosiloxane.

Alternatively, the adhesion promoter may comprise an unsaturated or epoxy-functional compound. The adhesion promoter may comprise an unsaturated or epoxy-functional alkoxysilane. For example, the functional alkoxysilane can have the formula $R^{22}_t Si(OR^{23})_{(4-t)}$, where subscript t is 1, 2, or 3, alternatively subscript t is 1. Each $R^{22}$ is independently a monovalent organic group with the proviso that at least one $R^{22}$ is an unsaturated organic group or an epoxy-functional organic group. Epoxy-functional organic groups for $R^{22}$ are exemplified by 3-glycidoxypropyl and (epoxycyclohexyl) ethyl. Unsaturated organic groups for $R^{22}$ are exemplified by 3-methacryloyloxypropyl, 3-acryloyloxypropyl, and unsaturated monovalent hydrocarbon groups such as vinyl, allyl, hexenyl, undecylenyl. Each $R^{23}$ is independently a saturated hydrocarbon group of 1 to 4 carbon atoms, alternatively 1 to 2 carbon atoms. $R^{23}$ is exemplified by methyl, ethyl, propyl, and butyl.

Examples of suitable epoxy-functional alkoxysilane type adhesion promoters include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and combinations thereof.

Alternatively, the adhesion promoter may comprise an epoxy-functional organosiloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. The epoxy-functional organosiloxane comprises one or more, alternatively two or more epoxy groups and at least one type of organogroup such as the alkyl, alkenyl, alkynyl, aryl, or organoheteryl. The epoxy group(s) independently may be covalently bonded directly to a silicon atom of the organosiloxanyl portion of the epoxy-functional organosiloxane or to any carbon atom of the organogroup. The epoxy group(s) may be located at internal, terminal, or both positions of the organosiloxanyl portion. The epoxy-functional organosiloxane may be an epoxy-functional diorganosiloxane, an epoxy-functional organo,hydrogensiloxane; or an epoxy-functional diorgano/(organo,hydrogen)siloxane. The "diorgano/(organo,hydrogen)" indicates the siloxane has both diorganoSi D units ("D") and organo-SiH D units ($D^H$) in the organosiloxanyl portion. The organogroups in any one of such diorganoSi D units may be the same as or different from each other. For example, the epoxy-functional diorganosiloxane may be a bis(alpha,omega-glycidoxyalkyl)-dialkyl/(alkyl,alkenyl)siloxane. The "dialkyl/(alkyl,alkenyl)" indicates siloxane has both dialkylSi D units and alkyl,alkenylSi D units. The "bis(alpha,omega-glycidoxyalkyl)" indicates a dialkyl/alkyl,alkenylsiloxanyl moiety has two terminal glycidoxyalkyl groups, and 0 or optionally 1 or more internal glycidoxyalkyl groups. Alternatively, the adhesion promoter may comprise a combination of an epoxy-functional alkoxysilane and an epoxy-functional siloxane. For example, the adhesion promoter is exemplified by a mixture of 3-glycidoxypropyltrimethoxysilane and a reaction product of hydroxy-terminated methylvinylsiloxane (i.e., hydroxy-terminated poly(methyl,vinyl)siloxane) with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methylvinyl/dimethylsiloxane copolymer.

Alternatively, the adhesion promoter may comprise an epoxy-functional organocyclosiloxane. The epoxy-functional organocyclosiloxane comprises one or more, alternatively two or more epoxy groups and at least one type of organogroup such as the alkyl, alkenyl, alkynyl, aryl, or organoheteryl. For example, the epoxy-functional organocyclosiloxane may be an epoxy-functional D3 to D6 diorganocyclosiloxane; an epoxy-functional D3 to D6 organo, hydrogencyclosiloxane; or an epoxy-functional D3 to D6 diorgano/(organo,hydrogen)cyclosiloxane. The D3 is an organocyclotrisiloxane; D4 is an organocyclotetrasiloxane; D5 is an organocyclopentasiloxane; and D6 is an organocyclohexasiloxane. The epoxy-functional organocyclosiloxane may have one or more, alternatively two or more organocyclosiloxanyl moieties, wherein any two organocyclosiloxanyl moieties may be linked to each other via an alkylene-diorganosiloxanylene-alkylene chain. For example, the epoxy-functional D3 to D6 organo,hydrogencyclosiloxane may be a bis(alpha,omega-glycidoxyalkyl-D3 to D6 organo,hydrogencyclosiloxane), wherein there are at least two glycidoxyalkyl moieties; there are at least two organo,hydrogencyclosiloxanyl moieties, which may be the same as or different from each other; and any two organo, hydrogencyclosiloxanyl moieties independently are linked to each other via an alkylene-diorganosiloxanylene-alkylene chain. The alkyl may be methyl and the alkenyl may be vinyl. Each chain may be the same as or different from each other, may be linear or branched, and may have a backbone of from 3 to 100, alternatively from 5 to 90, alternatively from 8 to 50 atoms, wherein the backbone atoms are C, Si, and O. The epoxy group(s) independently may be covalently bonded directly to a silicon atom of the organocyclosiloxanyl moiety or, when there are two or more organocyclosiloxanyl moieties, to a silicon atom of the alkylene-diorganosiloxanylene-alkylene chain; or the epoxy group(s) may be covalently bonded directly to any carbon atom of any organogroup thereof. The groups in any D unit may be the same as or different from each other.

Alternatively, the adhesion promoter may comprise an aminofunctional silane, such as an aminofunctional alkoxysilane exemplified by $H_2N(CH_2)_2Si(OCH_3)_3$, $H_2N(CH_2)_2Si(OCH_2CH_3)_3$, $H_2N(CH_2)_3Si(OCH_3)_3$, $H_2N(CH_2)_3Si(OCH_2CH_3)_3$, $CH_3NH(CH_2)_3Si(OCH_3)_3$, $CH_3NH(CH_2)_3Si(OCH_2CH_3)_3$, $CH_3NH(CH_2)_5Si(OCH_3)_3$, $CH_3NH(CH_2)_5Si(OCH_2CH_3)_3$, $H_2N(CH_2)_2NH(CH_2)_3Si(OCH_3)_3$, $H_2N(CH_2)_2NH(CH_2)_3Si(OCH_2CH_3)_3$, $CH_3NH(CH_2)_2NH(CH_2)_3Si(OCH_3)_3$, $CH_3NH(CH_2)_2NH(CH_2)_3Si(OCH_2CH_3)_3$, $C_4H_9NH(CH_2)_2NH(CH_2)_3Si(OCH_3)_3$, $C_4H_9NH(CH_2)_2NH(CH_2)_3Si(OCH_2CH_3)_3$, $H_2N(CH_2)_2SiCH_3(OCH_3)_2$, $H_2N(CH_2)_2SiCH_3(OCH_2CH_3)_2$, $H_2N(CH_2)_3SiCH_3(OCH_3)_2$, $H_2N(CH_2)_3SiCH_3(OCH_2CH_3)_2$, $CH_3NH(CH_2)_3SiCH_3(OCH_3)_2$, $CH_3NH(CH_2)_3SiCH_3(OCH_2CH_3)_2$, $CH_3NH(CH_2)_5SiCH_3(OCH_3)_2$, $CH_3NH(CH_2)_5SiCH_3(OCH_2CH_3)_2$, $H_2N(CH_2)_2NH(CH_2)_3SiCH_3(OCH_3)_2$, $H_2N(CH_2)_2NH(CH_2)_3SiCH_3(OCH_2CH_3)_2$, $CH_3NH(CH_2)_2NH(CH_2)_3SiCH_3(OCH_3)_2$, $CH_3NH(CH_2)_2NH(CH_2)_3SiCH_3(OCH_2CH_3)_2$, $C_4H_9NH(CH_2)_2NH(CH_2)_3SiCH_3(OCH_3)_2$, $C_4H_9NH(CH_2)_2NH(CH_2)_3SiCH_3(OCH_2CH_3)_2$, and a combination thereof.

The concentration of adhesion promoter, when present, may be from 0.1 to 5 wt %, alternatively from 0.1 to 7 wt %, alternatively from 0.1 to 5 wt %, alternatively from 0.1 to 2 wt %, alternatively from 0.2 to 1.0 wt all based on weight of the curable silicone composition.

The silicone extender may be an unsubstituted hydrocarbyl-containing MD organosiloxane such as a bis(trihydrocarbyl-terminated) dihydrocarbylorganosiloxane, wherein each hydrocarbyl independently is unsubstituted $(C_1-C_{10})$alkyl (e.g., methyl), $(C_2-C_{10})$alkenyl, $(C_2-C_{10})$alkynyl, benzyl, phenethyl, phenyl, tolyl, or naphthyl. Examples of the silicone extender are polydimethylsiloxanes, including DOW CORNING® 200 Fluids, Dow Corning Corporation, Midland, Mich., USA. These fluids may have kinematic viscosity ranging from 50 to 100,000 centiStokes (cSt; 50 to 100,000 square millimeters per second ($mm^2$/s)), alternatively 50 to 50,000 cSt (50 to 50,000 $mm^2$/s), and alternatively 12,500 to 60,000 cSt (12,500 to 60,000 $mm^2$/s). The kinematic viscosity is measured according to the method described later. In some embodiments the curable silicone composition and CSM lack the silicone extender; in other embodiments they further comprise the silicone extender. The concentration of the silicone extender, when present, may be from 0.1 to 10 wt %, alternatively from 0.5 to 5 wt %, alternatively from 1 to 5 wt %, all based on weight of the curable silicone composition.

The curing inhibitor may be the hydrosilylation reaction inhibitor when the curable silicone composition is a hydrosilylation curable silicone composition. The hydrosilylation reaction inhibitor may be used to delay onset of, inhibit, slow the reaction rate of, or prevent start of the hydrosilylation reaction of the hydrosilylation-curable organosiloxane as compared to that of the same composition but with the hydrosilylation reaction inhibitor omitted therefrom.

Examples of suitable hydrosilylation reaction inhibitors are acetylenic alcohols, silylated acetylenic compounds, cycloalkenylsiloxanes, ene-yne compounds, phosphines, mercaptans, hydrazines, amines, fumarate diesters, and maleate diesters, Examples of the acetylenic alcohols are 1-propyn-3-ol; 1-butyn-3-ol; 2-methyl-3-butyn-2-ol; 3-methyl-1-butyn-3-ol; 3-methyl-1-pentyn-3-ol; 4-ethyl-1-octyn-3-ol; 1-ethynyl-1-cyclohexanol; 3,5-dimethyl-1-hexyn-3-ol; 4-ethyl-1-octyn-3-ol; 1-ethynyl-1-cyclohexanol; 3-phenyl-1-butyn-3-ol; and 2-phenyl-3-butyn-2-ol. E.g., the hydrosilylation reaction inhibitor may be 1-ethynyl-1-cyclohexanol. Examples of cycloalkenylsiloxanes are methylvinylcyclosiloxanes, e.g., 1,3,5,7-tetramethyl-1,3,5,7-tetravinylcyclotetrasiloxane and 1,3,5,7-tetramethyl-1,3,5,7-tetrahexenylcyclotetrasiloxane. Examples of ene-yne compounds are 3-methyl-3-penten-1-yne and 3,5-dimethyl-3-hexen-1-yne. An example of phosphines is triphenylphosphine. Examples of fumarate diesters are dialkyl fumarates, dialkenyl fumarates (e.g., diallyl fumarates), and dialkoxyalkyl fumarates. Examples of maleate diesters are dialklyl maleates and diallyl maleates. Examples of silylated acetylenic compounds are (3-methyl-1-butyn-3-oxy)trimethylsilane, ((1,1-dimethyl-2-propynyl)oxy)trimethylsilane, bis(3-methyl-1-butyn-3-oxy)dimethylsilane, bis(3-methyl-1-butyn-3-oxy)silanemethylvinylsilane, bis((1,1-dimethyl-2-propynyl)oxy)dimethylsilane, methyl(tris(1,1-dimethyl-2-propynyloxy))silane, methyl(tris(3-methyl-1-butyn-3-oxy))silane, (3-methyl-1-butyn-3-oxy)dimethylphenylsilane, (3-methyl-1-butyn-3-oxy)dimethylhexenylsilane, (3-methyl-1-butyn-3-oxy)triethylsilane, bis(3-methyl-1-butyn-3-oxy)methyltrifluoropropylsilane, (3,5-dimethyl-1-hexyn-3-oxy)trimethylsilane, (3-phenyl-1-butyn-3-oxy)diphenylmethylsilane, (3-phenyl-1-butyn-3-oxy)dimethylphenylsilane, (3-phenyl-1-butyn-3-oxy)dimethylvinylsilane, (3-phenyl-1-butyn-3-oxy)dimethylhexenylsilane, (cyclohexyl-1-ethyn-1-oxy)dimethylhexenylsilane, (cyclohexyl-1-ethyn-1-oxy)dimethylvinylsilane, (cyclohexyl-1-ethyn-1-oxy)diphenylmethylsilane, and (cyclohexyl-1-ethyn-1-oxy)trimethylsilane. The hydrosilylation reaction inhibitor may be methyl(tris(1,1-dimethyl-2-propynyloxy))silane or ((1,1-dimethyl-2-propynyl)oxy)trimethylsilane. The hydrosilylation reaction inhibitor may be a combination of any two or more of the foregoing examples, either taken from within a single structural class or from at least two different structural classes. In some embodiments the curable silicone composition and CSM lack the hydrosilylation reaction inhibitor; in other embodiments they further comprise the hydrosilylation reaction inhibitor. The concentration of the hydrosilylation reaction inhibitor, when present, may be from 0.1 to 5 wt %, alternatively from 0.5 to 2 wt %, all based on weight of the curable silicone composition.

The defoamer may be used to inhibit or prevent foaming during formation of the curable silicone composition or the curable organosiloxane composition. In some embodiments the curable silicone composition and CSM lack the defoamer; in other embodiments they further comprise the defoamer.

The biocide may be an antimicrobial compound, antibacterial compound, antiviral compound, fungicide, herbicide, or pesticide. The biocide may be used to inhibit contamination or degradation of the curable silicone composition or the curable organosiloxane composition during manufacturing, storage, transportation, or application thereof; and/or inhibit contamination or degradation of the CSM during curing and or use in the electrical component. In some embodiments the curable silicone composition and CSM lack the biocide; in other embodiments they further comprise the biocide.

The chain lengthener may be used to extend lengths of chains of ingredients (A), (B), or (A) and (B) before any coupling or crosslinking occurs during curing of the curable silicone composition. Examples of suitable chain lengtheners are difunctional silanes (e.g., 1,1,2,2-tetramethyldisilane) and difunctional siloxanes (e.g., a dimethylhydrogen-terminated polydimethylsiloxane having a degree of polymerization (DP) of from 3 to 50, e.g., from 3 to 10). In some embodiments the curable silicone composition and CSM lack the chain lengthener; in other embodiments they further comprise the chain lengthener. The concentration of the chain lengthener, when present, may be from 0.1 to 10 wt %, alternatively from 0.5 to 5 wt %, all based on weight of the curable silicone composition.

The chain endblocker may be used to terminate a chain and prevent further extending or crosslinking during curing of the curable silicone composition. The chain endblocker may be an unsubstituted hydrocarbyl-containing siloxane M unit, wherein the hydrocarbyl independently is as described for the hydrocarbyl of the silicone extender. An example of a suitable chain endblocker is an organosiloxane having one or more trimethylsiloxy groups. In some embodiments the curable silicone composition and CSM lack the chain endblocker; in other embodiments they further comprise the chain endblocker. The concentration of the chain endblocker, when present, may be from 0.1 to 10 wt %, alternatively from 0.5 to 5 wt %, all based on weight of the curable silicone composition.

The anti-aging additive may be used to delay onset of, inhibit, decrease rate of, or prevent degradation of the curable silicone composition and/or CSM when exposed to degradation-promoting condition(s). Examples of degradation promoting conditions are exposure to oxidant, ultraviolet light, heat, moisture, or a combination of any two or more thereof. Examples of suitable anti-aging additives are antioxidants, UV absorbers, UV stabilizers, heat stabilizers, desiccants, and combinations thereof. Suitable antioxidants include sterically hindered phenols (e.g., vitamin E). Suitable UV absorbers/stabilizers include phenol. Suitable heat stabilizers include iron oxides and carbon blacks. Suitable moisture stabilizers include anhydrous forms of silica (e.g., fumed silica), magnesium oxide and calcium oxide. In some embodiments the curable silicone composition and CSM lack the anti-aging additive; in other embodiments they further comprise the anti-aging additive. The concentration of the anti-aging additive, when present, may be from 0.01 to 5 wt %, alternatively from 0.1 to 2 wt %, all based on weight of the curable silicone composition.

In some embodiments the curable silicone composition is a curable silicone composition comprising a blend of the following ingredients: an isoalkanes mixture comprising at least three of ($C_{12}$-$C_{16}$)isoalkanes and has an initial boiling point of greater than 210 degrees Celsius and an end boiling point of less than 270 degrees Celsius and the hydrocarbon vehicle is at a concentration of from 4.5 to 12 wt % based on weight of the curable silicone composition; a hydrosilylation-curable polydimethylsiloxane composition comprising at least one vinyl-functional polydimethylsiloxane compound having on average per molecule at least 1 vinyl moieties, at least one trimethylsiloxy-terminated dimethyl methylhydrogensilicon compound having on average per molecule at least 1.1 Si—H moieties, a microencapsulated platinum hydrosilylation catalyst, and bis(alpha,omega-glycidoxyalkyl)-(alkyl,alkenyl)siloxane, and bis(alpha, omega-glycidoxyalkyl-D3 to D6 alkyl,hydrogencyclosiloxane; and wherein the vinyl-functional polydimethylsiloxane compound is from 70 to 75 wt %, the trimethylsiloxy-terminated dimethyl methylhydrogensilicon compound is from 1 to 5 wt %, the microencapsulated hydrosilylation catalyst is from 10 to 15 wt %, the bis(alpha,omega-glycidoxyalkyl)-dialkyl/(alkyl,alkenyl)siloxane is from 1 to 10 wt %, and the bis(alpha,omega-glycidoxyalkyl-D3 to D6 alkyl,hydrogencyclosiloxane is from 0 to 7 wt %, all of the curable polydimethylsiloxane composition; and wherein together the trimethylsiloxy-terminated dimethyl methylhydrogensilicon compound, microencapsulated hydrosilylation catalyst, and the bis(alpha,omega-glycidoxyalkyl)-dialkyl/(alkyl,alkenyl)siloxane, and bis(alpha,omega-glycidoxyalkyl-D3 to D6 alkyl,hydrogencyclosiloxane are from 20 to 30 wt % of the curable organosiloxane composition; Cu—Ag core-shell particles are at a concentration of from 79.9 to 86.0 wt % based on weight of the curable silicone composition; wherein the total concentration of silver is from 7.5 to 12 wt % based on weight of the curable silicone composition; and carbon nanotubes at a concentration of from 0.50 to 1.5 wt % based on weight of the curable silicone composition; and wherein the curable silicone composition is characterizable by a volume resistivity less than 0.00090 Ohm-centimeter measured according to Volume Resistivity Test Method and a thermal conductivity of greater than or equal to 6 W/(m*K) measured according to Thermal Properties Test Method.

Alternatively, the vinyl-functional polydimethylsiloxane compound may be from 70 to 75 wt % of the hydrosilylation-curable polydimethylsiloxane composition; the trimethylsiloxy-terminated dimethyl methylhydrogensilicon compound may be from 1 to 5 wt % of the hydrosilylation-curable polydimethylsiloxane composition; the microencapsulated hydrosilylation catalyst may be from 10 to 15 wt % of the hydrosilylation-curable polydimethylsiloxane composition; the bis(alpha,omega-glycidoxyalkyl-D3 to D6 alkyl, hydrogencyclosiloxane) may be from 0 to 7 wt % (e.g., 0 wt %), alternatively from 0.1 to 7 wt % of the hydrosilylation-curable polydimethylsiloxane composition, and the bis(alpha,omega-glycidoxyalkyl)-dialkyl/(alkyl,alkenyl)siloxane adhesion promoter may be from 0.1 to 10 wt %, alternatively from 1 to 10 wt %, of the hydrosilylation-curable polydimethylsiloxane composition. Prior to its use to prepare the curable silicone composition, the hydrosilylation-curable polydimethylsiloxane composition may lack the hydrocarbon vehicle, Cu—Ag core-shell particles, and MTF, if any. As for concentrations of the ingredients in terms of wt % of the curable silicone composition prepared with the hydrosilylation-curable polydimethylsiloxane composition, the vinyl-functional polydimethylsiloxane compound may be from 16 to 18 wt % (e.g., 17 wt %) of the curable silicone composition, the trimethylsiloxy-terminated dimethyl methylhydrogensilicon compound may be from 0.1 to 2 wt % (e.g., 1 wt %) of the curable silicone composition, the microencapsulated hydrosilylation catalyst may be from 2 to 5 wt % (e.g., 3 wt %) of the curable silicone composition, and the bis(alpha,omega-glycidoxyalkyl)-dialkyl/(alkyl,alkenyl)siloxane adhesion promoter may be from 1 to 4 wt % (e.g., 2 wt %) of the curable silicone composition. In such an embodiment of the curable silicone composition the concentration of the hydrocarbon vehicle may be from 4.9 to 12 wt % of the curable silicone composition, the Cu—Ag core-shell particles may be Cu—Ag core-shell flakes, alternatively Cu—Ag core-shell spheres, and the MTF, if any, may be multi-walled carbon nanotubes, wherein the multi-walled carbon nanotubes are at a concentration of from 0.50 to 0.94 wt %, all of the curable silicone composition. In such an embodiment, the total concentration of Cu—Ag core-shell may be from 79.5 to 86 wt % of the curable silicone composition. When the curable silicone composition also contains the bis(alpha,omega-glycidoxyalkyl-D3 to D6 alkyl,hydrogencyclosiloxane), the concentration of the bis(alpha,omega-glycidoxyalkyl-D3 to D6 alkyl,hydrogencyclosiloxane) may be from 0.5 to 1.5 wt % (e.g., 1 wt %) of the curable silicone composition.

The concentration of SiH-containing ingredients may be adjusted in the curable silicone composition such that the total SiH concentration in the curable silicone composition may be reached with different proportions of the SiH-containing ingredients. For example, when the curable silicone composition also contains the bis(alpha,omega-glycidoxyalkyl-D3 to D6 alkyl,hydrogencyclosiloxane), the concentration of the trimethylsiloxy-terminated dimethyl methylhydrogensilicon compound may be from 0.2 to 0.9 wt % (e.g., 0.5 wt %) and the concentration of the bis(alpha,omega-glycidoxyalkyl-D3 to D6 alkyl,hydrogencyclosiloxane) may be from 0.5 to 1.5 wt % (e.g., 1 wt %), both based on weight of the curable silicone composition. When the curable silicone composition lacks (i.e., 0 wt %) the bis(alpha,omega-glycidoxyalkyl-D3 to D6 alkyl,hydrogencyclosiloxane), the concentration of the trimethylsiloxy-terminated dimethyl methylhydrogensilicon compound may be from 0.2 to 1.5, alternatively from 0.9 to 1.5 wt % based on weight of the curable silicone composition.

It is generally known in the art how to prepare curable silicone compositions comprising multiple ingredients including fillers. For example, the curable silicone composition and curable organosiloxane composition may be prepared by a method comprising combining the ingredients such as by mixing. The ingredients may be combined in any order, simultaneously, or any combination thereof unless otherwise noted herein. Typically mechanics of the combining comprises contacting and mixing ingredients with equipment suitable for the mixing. The equipment is not specifically restricted and may be, e.g., agitated batch kettles for relatively high flowability (low dynamic viscosity) compositions, a ribbon blender, solution blender, co-kneader, twin-rotor mixer, Banbury-type mixer, mill, or extruder. The method may employ continuous compounding equipment, e.g., extruders such as twin screw extruders (e.g., Baker Perkins sigma blade mixer or high shear Turello mixer), may be used for preparing compositions containing relatively high amounts of particulates. The curable silicone composition and curable organosiloxane composition may be prepared in batch, semi-batch, semi-continuous, or continuous process. General methods are known, e.g., US 2009/0291238; US 2008/0300358.

The curable silicone composition and curable organosiloxane composition may be prepared as a one part or multiple part composition. The one-part composition may be prepared by combining all ingredients by any convenient means, such as mixing, e.g., as described for the method. All mixing steps or just a final mixing step may be performed under conditions that minimize or avoid heating (e.g., maintain temperature below 30° C. during mixing). The multiple part (e.g., 2 part) composition may be prepared where at least a primary organosiloxane (e.g., the diorganosiloxane such as ingredient (A)), and optionally any other organosilicon compound (e.g., an adhesion promoter and/or chain extender/crosslinker such as the organohydrogensilicon compound of ingredient (B)), is stored in one part, and any catalyst (e.g., ingredient (C)) is stored in a separate part, and the parts are combined (e.g., by mixing) shortly before use of the curable organosiloxane composition. Alternatively, the primary organosiloxane and any catalyst may be stored in one part and any other organosilicon compound may be stored in a separate part. Typically the chain extender/crosslinker and the catalyst are stored in separate parts when the catalyst is catalytically active (not microencapsulated or not inhibited). A master batch containing the primary organosiloxane may be prepared and stored until ready for dilution to prepare the one part. An illustrative preparation is described later in the examples. The hydrocarbon vehicle and Cu—Ag core-shell particles may be stored in either part or both parts or in a separate part.

When the curable silicone composition further comprises the MTF and the MTF is the carbon nanotubes, the carbon nanotubes may be mixed with at least a portion of the curable organosiloxane composition to form a master batch comprising a dispersion of the carbon nanotubes and at least the portion of the curable organosiloxane composition. The dispersing of the carbon nanotubes into the portion of the curable organosiloxane composition to prepare the master batch may be carried out by any suitable mixing means. Examples of suitable mixing means are ultrasonication, dispersion mixing, planetary mixing, and three roll milling. Alternatively or additionally, surfactants may be used to facilitate dispersion of the carbon nanotubes in a carrier liquid (e.g., water) to form an emulsion, which may be mixed with the curable organosiloxane composition to give a temporary mixture, and then the carrier liquid (e.g., water) may be removed from the temporary mixture to give the master batch. For convenience, the carrier liquid may have having a boiling point from 20° to 150° C. When a surfactant is used, the carrier liquid typically is water or an aqueous mixture, but the carrier liquid may be non-aqueous such as methanol or a polydimethylsiloxane fluid having a boiling point from 20° to 150° C. Once formed the master batch may then be mixed with the other ingredients of the curable silicone composition, including any remaining portion of the curable organosiloxane composition, to prepare the curable silicone composition.

Once prepared the curable silicone composition and curable organosiloxane composition may be used immediately or stored for any practical period, e.g., ≥1 hour, alternatively ≥1 day, alternatively ≥1 week, alternatively ≥30 days, alternatively ≥300 days, alternatively ≥2 years before use. The curable silicone composition and curable organosiloxane composition may be stored in a container that protects the curable silicone composition or curable organosiloxane composition from exposure to curing conditions (e.g., heat or moisture). The storage may be at a suitable temperature (e.g., −40°≤20° C., e.g., −30° C.) and, if desired, under an inert gas atmosphere (e.g., $N_2$ or Ar gas). When desired, curing of the curable silicone composition may be initiated by exposing it to the curing conditions to give the CSM.

The curable silicone composition may be characterized by its own characteristics and/or, indirectly, by the characteristics of the CSM prepared therefrom. For example, the curable silicone composition may be characterizable by a curing temperature <160° C., resistance to oxidation of copper(0) of the Cu core, volume resistivity, electrically conductivity, thermal conductivity, thermal impedance, elongation at break, tensile strength, or any combination thereof of the CSM.

The conductive silicone material (CSM). The CSM may be in the form of a gel, grease, adhesive, or other form of silicone material. In some embodiments the CSM is a gel, alternatively a grease, alternatively an adhesive. The adhesive may be prepared from embodiments of the curable silicone composition that further comprise one or more of the adhesion promoters. The CSM may comprise a binder matrix comprising any cured silicone composition such as a condensation cured organosiloxane, free radical cured organosiloxane, or hydrosilylation cured organosiloxane. Curing the curable organosiloxane composition of the curable silicone composition yields the cured organosiloxane binder matrix, wherein the Cu—Ag core-shell particles may be unsintered. Some embodiments of the present invention provide the CSM as a composition of matter, which may be described as a product-by-process. Other embodiments provide the CSM as a composite structure comprising the Cu—Ag core-shell particles and MTF, if any, widely dispersed throughout a binder matrix (cured organosiloxane matrix) comprising a product of curing the curable silicone composition. The as-cured CSM facilitate transmission of electric current and/or heat as is, e.g., such that an as-cured CSM disposed between first and second components of an electrical device facilitates conduction of electric current and/or heat, as the use may be, between the first and second components via the as-cured CSM without having to expose the conductive filler (Cu—Ag core-shell particles) in the as-cured CSM (e.g., without having to abrade a surface of the as-cured CSM). The composite structure of the CSM may be characterized by a cross-sectional image, longitudinal image, or two- or three-dimensional arrangement of the Cu—Ag core-shell particles and MTF, if any, in the binder matrix. Any carbon nanotubes may require higher magnification viewing to be seen in the cross-sectional image compared to any magnification that may be used to view the Cu—Ag core-shell particles, and/or cured organosiloxane matrix. The CSM may be characterized by a volume resistivity of less than 0.020 Ohm-cm, alternatively <0.0010 Ohm-cm, or any one of the aforementioned volume resistivity values; and a thermal conductivity of 2.97 W/(m*K), alternatively >3 W/(m*K), or any one of the aforementioned Thermal Conductivity values.

The CSM, when used as an adhesive, preferably prepared from an embodiment of the curable silicone composition further comprising at least one of the adhesion promoters, may provide adhesion to a variety of different substrates such as a metal (e.g., aluminum, nickel, copper, and other metal substrates), a ceramic, or a silica glass substrate. In some embodiments, surfaces of some substrates may be treated first to remove or change composition of a surface layer, which may be of a different material than a basal layer of the substrate. Alternatively, the same surface layer may be untreated or mechanically patterned before being contacted with the curable silicone composition and/or CSM. Examples of surface layers that might be removed, alternatively left on, are metal oxide layers, protective coatings (e.g., organic coatings applied to metals that are prone to oxidation when exposed to ambient air), and powders such as powder residues that may have been deposited on the substrate be mechanical etching of the substrate. Examples of metal substrates are the electrically conductive metals and metal alloys described before, alternatively aluminum, copper, gold, nickel, niobium, palladium, platinum, silver, stainless steels, tantalum, and titanium. The surface layer of the substrate receiving the curable silicone composition or CSM may be a material that is capable of chemically bonding to the CSM, which after being prepared by curing the curable silicone composition thereon is adhered to the material such that the adhesive strength is achieved. The CSM may also provide adhesion to a variety of different organic polymer substrates that have first been primed or treated. Examples of organic polymer substrates that may be primed or treated to form a surface thereon for adhering to the CSM are polyethylene and polypropylene. If the surface layer is treated (primed), the priming or treating the surface of the substrate may comprise treating a working portion of the surface thereof with an adhesion promoter or by chemical etching, mechanical etching, or plasma treating the working portion of the surface. Examples of suitable adhesion promoters are OFS 6040 XIAMETER, DOW CORNING P5200 Adhesion Promoter, and 1200 OS Primer Clear. Generally, increasing curing temperature and/or curing time will improve adhesion.

Different embodiments of the CSM may be compared by characterizing their adhesive strength on a same substrate material such as a particular silica glass substrate according to the Peel Resistance Test Method or the Shear Strength Test Method MIL-STD-883J, both described later. in the Peel Resistance Test Method, when the substrate material is an unprimed or untreated substrate, alternatively a substrate that has been previously primed or treated, the CSM may be characterizable by an adhesive strength of at least 0.3 Newton (N) when measured on silica glass substrate according to the Peel Resistance Test Method. Alternatively, the CSM may be characterizable by an adhesive strength of at least 0.1 N, alternatively at least 0.3 N, alternatively at least 0.5 N, alternatively at least 1.0 N. The CSM may have any maximum adhesive strength. In some embodiments the CSM may have a maximum adhesive strength of 5 N, alternatively 2 N, alternatively 1 N, alternatively 0.3 N. The adhesive strength value of a particular CSM may vary depending on the material of the substrate. For purposes of characterizing an embodiment of the curable silicone composition after curing as being a CSM, the substrate may be borosilicate silica glass. Different CSMs may be characterized or compared by their adhesive strength according to the Peel Resistance Test Method when measured on a same substrate such as the borosilicate silica glass substrate. The silica glass may be Eagle XG silica glass (e.g., HS-20/40) from Corning Inc., Corning, N.Y., USA. In the Shear Strength Test Method MIL-STD-883J, when the substrate is aluminum (e.g., AlClad aluminum), the CSM may be characterizable by an adhesive strength of at least 10 kilograms*force (kgf), alternatively at least 14 kgf, alternatively at least 16 kgf, alternatively at least 18 kgf, alternatively at least 20 kgf, alternatively at least 21 kgf, alternatively at least 22 kgf, alternatively at least 23 kgf, alternatively at least 24 kgf, alternatively at least 25 kgf. The CSM may be characterizable by an adhesive strength of at most 50 kgf, alternatively at most 40 kgf, alternatively at most 30 kgf, alternatively at most 26 kgf.

The CSM independently may be employed in some applications as an adhesive but not as a means for conducting electrical current, as an adhesive but not as a means for conducting heat, or as an adhesive but not as a means for conducting electrical current and heat. Such applications include using the CSM for adhering same or different substrates comprising non-electrically conductive materials to each other. Reiterated, the use of the CSM as an adhesive may include applications wherein the CSM does not function or need to function to conduct electric current. Alternatively, the CSM may be used in some applications as an adhesive and, at least periodically, as a means for conducting electric current between at least two electrical components of an electrical device and/or as a means for conducting heat between two components (i.e., heat generating electrical component and heat dissipator) of an electrical device as described herein. The heat dissipator component of the electrical device may be an electrical component, alternatively may not be an electrical component. The at least two (electrical) components have opposing surfaces between which contact the CSM. The periods during which the electric current may be conducted therebetween are times when the electrical components or electrical components and electrical device are electrically active. Alternatively, the CSM may be employed in some applications as a means for conducting electric current and/or heat between at least two (electrical) components of an electrical device, but not as an adhesive for adhering the (electrical) components to each other. Reiterated, the use of the CSM as a means for conducting electric current and/or heat between at least two (electrical) components of an electrical device may include applications where the (electrical) components are being held in electrical and/or thermal operative contact to the CSM via a means other than adhesive action. Examples of such other non-adhesive means are where the (electrical) components are disposed in friction fit with each other or with a common housing, a mechanical fastening means such as an externally screw-threaded fastener, solder (limited to contact with a very minor areas of the opposing surfaces of the electrical components), and a clamp.

The CSM may be used as an electrically conductive adhesive (ECA) in electrical operative communication with two or more electrical components, wherein each electrical component may, alternatively may not, be a heat generating electrical component. An electrical device comprising first and second electrical components having opposing surfaces and the CSM disposed between and in adhering operative contact with the opposing surfaces of the first and second electrical components; wherein the first and second electrical components are disposed for electrical operative communication with each other via the CSM; and wherein the CSM is characterizable by a volume resistivity of less than 0.020 Ohm-cm, alternatively <0.0010 Ohm-cm, or any one of the aforementioned volume resistivity values. The CSM binds the electrical components together and facilitates transfer of electric current between them via the CSM during operation of the electrical device. A wide variety of electrical devices may employ the CSM. The opposing surfaces of the first and second electrical components may be surfaces of an untreated substrate as described above. Alternatively, one or both of the opposing surfaces of the first and second electrical components may be surfaces of substrates that may have previously been primed or treated to form a surface thereon for adhering to the CSM.

Alternatively or additionally, the CSM may be used as a thermally conductive adhesive (TCA) in thermal operative communication with two or more components, wherein at least one component is a heat generating electrical component and at least one component is a heat dissipating component. The first electrical component mentioned earlier may be an example of the at least one heat generating electrical component. The heat dissipating component may, alternatively may not be an electrical component. When the heat dissipating component is an electrical component, the second electrical component mentioned earlier may be an example of the at least one heat dissipating component. The invention includes an electrical device sequentially comprising a heat generating electrical component, the CSM disposed in indirect or direct thermal communication and contact with the heat generating electrical component, and a heat dissipator disposed in indirect or direct thermal communication and contact with the CSM. The CSM has a thermal conductivity of greater than or equal to 2.9 W/(m*K), alternatively ≥3.0 W/(m*K), alternatively ≥4.0 W/(m*K), alternatively ≥5.0 W/(m*K), alternatively ≥6.0 W/(m*K), alternatively ≥7.0 W/(m*K), alternatively ≥8.0 W/(m*K), alternatively ≥9.0 W/(m*K), or any one of the aforementioned thermal conductivity values, all measured according to Thermal Properties Test Method. Alternatively or additionally, the CSM has a thermal conductivity of less than 15 W/(m*K), alternatively <14 W/(m*K), alternatively <13 W/(m*K), alternatively <12 W/(m*K), alternatively <11 W/(m*K). The opposing surfaces of the first and second electrical components may be surfaces of an untreated substrate as described above. Alternatively, one or both of the opposing surfaces of the first and second electrical components may be surfaces of substrates that may have previously been primed or treated to form a surface thereon for adhering to the CSM. The CSM binds the components together and facilitates transfer of heat between them, or from a heat generating electrical component to a heat dissipator, via the CSM during operation of the electrical device.

As mentioned before, the CSM may be further characterizable by improved tensile properties such as tensile strength and elongation at break, as measured according to the Tensile Strength Test Method described later. In some embodiments the CSM may have an elongation at break of at least 50%, alternatively >70%, alternatively >90%, alternatively ≥100%, alternatively >110%, alternatively >120%. Additionally, the elongation at break may be at most 200%, alternatively ≤180%, alternatively <170%. In some embodiments the CSM may have a tensile strength (peak stress) of <3.45 MPa (<500 psi), alternatively <3.38 MPa (<490 psi), alternatively <3.10 MPa (<450 psi), alternatively <2.76 MPa (<400 psi).

A variety of electrical devices may employ the CSM as a TCA. The term "electrical device" means manufactured articles that convert electricity in simple ways to another form of energy or that modulate electricity to carry out an electronic function. Examples of the former electrical devices are batteries, electric motors, incandescent light bulbs, and toasters. Examples of the latter electrical devices are integrated circuits, light emitting diodes, switches, and sensors. The electrical device comprising the curable silicone composition and/or the CSM may be an analog electrical device or digital electrical device. Additional examples of electrical devices that may be manufactured with the curable silicone composition and CSM are antenna, attenuators, light ballast, batteries, bimetallic strips, brushes, capacitors, electrochemical cells, control boards, instrument panels, distributors, electrographs, electrostatic generators, electronic filters, light flashers, fuses, inductors, jacks, plugs, electrostatic precipitators, rectifiers, relays, resistors, spark arrestors, suppressors, terminals, and electronics circuit board wiring patterns. Examples of such electrical devices also include higher order electrical devices, which may contain a plurality of such electrical components. The higher order electrical devices include photovoltaic cell modules and panels, and electronic devices such as computers, tablets, routers, servers, telephones, and smartphones. The use of the CSM in the electrical devices is not particularly limited, and for example the CSM may be used in place of any electrically conductive adhesive (ECA) and/or thermally conductive adhesive (TCA) of ad rem prior art electrical device.

Examples of electrical devices that may be manufactured with the curable silicone composition and CSM are the foregoing listed electrical components and higher order electrical devices, which may contain a plurality of such electrical components. The use of the CSM in the electrical devices is not particularly limited, and for example the CSM may be used in place of any electrically conductive adhesive (ECA) and/or thermally conductive adhesive (TCA) of ad rem prior art electrical device. The electrical device may comprise at least one heat generating component, the CSM, and at least one heat dissipator. The at least one heat generating component may be a miniaturized electronic device, may be a silicon carbide-based electronic device, or both. The heat dissipator may be a heat sink or a heat spreader, alternatively the heat sink, alternatively the heat spreader. The heat spreader may be an Integrated Heat Spreader (IHS), which as a component of the electrical device that may serve two or more functions. Examples of suitable IHS are a thermally conductive cover, thermally conductive plate, or thermally conductive lid. The thermally conductive lid may be a thermally conductive lid for use in a flip-chip electrical device.

The invention includes an embodiment of the electronic device that employs the CSM as a thermal interface material (TIM), wherein the electronic device comprises:
   a first electronic component,
   a second component, and
   the CSM as a thermal interface material (TIM).
wherein the TIM is interposed between and in independent thermal communication with the first electronic component and the second component. The second component may, alternatively may not be an electrical component. The first electronic component may be a semiconductor chip and the second component may be a heat sink. Alternatively, the first electronic component may be a semiconductor chip and the second component may be a heat spreader (TIM1 application). Alternatively, the first electronic component may be a heat spreader and the second component may be a heat sink (TIM2 application). In the electronic device the TIM1 and TIM2 may be the same or different composites. The embodiment of the electronic device may be made by the method of manufacturing described herein.

An embodiment of the immediately foregoing electronic device is a single chip or multi-chip package using the CSM and made by the method of manufacturing described herein. Said multichip package may comprise: a first heat-generating electronic component mounted to a substrate; a second heat-generating electronic component mounted to the substrate adjacent to the first heat-generating electronic component; an integrated heat spreader (IHS) mounted to the substrate so as to at least partially cover the first heat-generating electronic component and the second-heat-generating electronic component; wherein the IHS is in thermal operative communication with the first and second heat-generating electronic components and wherein at least one of conditions (A) to (C) is satisfied:

(A) the multichip package further comprises a lid seal adhesive and the IHS is connected to the substrate through the lid seal adhesive, which is the CSM; or (B) the multichip package further comprises a thermal interface material and the IHS is connected to at least one of the first heat-generating electronic component and the second heat-generating electronic component through the thermal interface material, which is the CSM, or (C) the multichip package further comprises a thermally conductive lid seal adhesive and the IHS is connected to the substrate through the thermally conductive lid seal adhesive, which is the CSM;

wherein each of the lid seal adhesive of (A), thermal interface material of (B), and thermally conductive lid seal adhesive of (C) is formed by curing the curable silicone composition and removing the hydrocarbon vehicle. Condition (A) may be satisfied, alternatively condition (B) may be satisfied, alternatively condition (C) may be satisfied, alternatively both conditions (A) and (B) may be satisfied, alternatively both conditions (B) and (C) may be satisfied, alternatively both conditions (A) and (B) are satisfied and condition (C) is not satisfied, alternatively both conditions (B) and (C) are satisfied and condition (A) is not satisfied. The heat-generating electronic component mentioned in earlier paragraphs may be the first heat-generating electronic component of condition (B) or the second heat-generating electronic component of condition (B).

FIG. 1 shows an electronic device 100 according to this invention. The device 100 comprises an electronic component (shown as an integrated circuit (IC) chip) 103 that is mounted to a substrate 104 by a solderball array 111 and chip underfill 109. The substrate 104 has solder balls 105 attached thereto through pads 110. A first interface material (TIM1) 106 is interposed between the IC chip 103 and a metal cover 107. The metal cover 107 acts as a heat spreader. A second interface material (TIM2) 102 is interposed between the metal cover 107 and a heat sink 101. Heat moves along a thermal path represented by arrows 108 when the device is operated. The CSM may be used to form the TIM1, alternatively used to form the TIM2, alternatively independently used to form both the TIM1 and TIM2. When the CSM is used to form both the TIM1 and TIM2, each CSM independently may be the same or different. That is, each curable silicone composition used to prepare the different CSM may be different. In some embodiments when the CSM is used as the TIM1, the CSM may also function as a lid seal adhesive. When the CSM functions as a lid seal adhesive, the curable silicone composition from which it has been made may further comprise at least one of the adhesion promoters. In some embodiments, at least the second interface material (TIM2) is an embodiment of the inventive CSM.

A method of manufacturing the electrical device comprising the first and second components having surfaces and the CSM, the method comprising depositing the curable silicone composition onto one or both surfaces of the first and second components, and orienting the first and second components so that their surfaces are opposing each other to give a preassembly comprising the curable silicone composition disposed between and in physical contact with the opposing surfaces of the first and second components; and curing the curable silicone composition between the opposing surfaces of the first and second components to give the electrical device, wherein the first component is a heat generating electrical component and the second component is a heat dissipator. The heat dissipator may, alternatively may not be an electrical component. The depositing may be performed in any suitable manner. E.g., a suitable manner of the depositing comprises disposing all of the curable silicone composition on a surface of one, but not both, of the first and second components, and then bringing the disposed curable silicone composition in opposing contact to the surface of the other one (i.e., the one lacking the curable silicone composition) of the first and second components to give the preassembly. Another suitable manner of the depositing comprises disposing a first portion of the curable silicone composition on one of the surfaces of the first and second components, disposing a second portion of the curable silicone composition on the other one of the surfaces of the first and second components, and then bringing the first and second portions of the disposed curable silicone composition in opposing contact to give the preassembly. The first and second portions of the curable silicone composition may be the same or different in amount, composition, batch, age, extent of curing, and/or other property (e.g., temperature). The invention contemplates that still other suitable manners may be used so long as the preassembly is produced therewith. It is generally known in the art how to prepare different component assemblies comprising a CSM prepared by curing a curable silicone composition. The electrical device comprises the first and second components and the conductive silicone material disposed between and in adhering operative contact with the opposing surfaces of the first and second components such that the first and second components are disposed for thermal operative communication with each other via the conductive silicone material. The CSM in the electrical device is characterizable by a volume resistivity of less than 0.020 Ohm-cm, alternatively <0.0010 Ohm-cm, or any one of the aforementioned values; and a thermal conductivity of 2.97 W/(m*K), alternatively >3 W/(m*K), or any one of the aforementioned Thermal Conductivity values.

The manufacturing method may comprise manufacturing more than one electrical device wherein curable silicone compositions having different rheologies are employed for manufacturing different ones of the electrical devices. For example, the method may comprise depositing a first curable silicone composition having a first thixotropic Index($\eta_1/\eta_{10}$) onto the opposing surfaces of the first and second components to give a first preassembly comprising the first curable silicone composition disposed between and in physical contact with the opposing surfaces of the first and second components; and curing the first curable silicone composition between the opposing surfaces of the first and second components to give a first electrical device; adjusting the rheology of the first curable silicone composition to give a second curable silicone composition having a second thixotropic Index($\eta_1/\eta_{10}$), wherein the first thixotropic Index($\eta_1/\eta_{10}$) and second thixotropic Index($\eta_1/\eta_{10}$) differ from each other by at least 0.3, alternatively at least 0.5, alternatively at least 1, alternatively at least 2, alternatively at least 3, alternatively at least 4, alternatively at least 5, all as a result of the adjusting; and depositing the second curable silicone composition onto opposing surfaces of third and fourth components to give a second preassembly comprising the second curable silicone composition disposed between and in physical contact with the opposing surfaces of the third and fourth components; and curing the second curable silicone composition between the opposing surfaces of the third and fourth components to give a second electrical device. The first and second components independently are electrical components or the first component is a heat generating electrical component and the second component is a heat dissipator. Also, the third and fourth components independently are electrical components or the third component is a heat generating electrical component and the fourth component is a heat dissipator.

Each depositing step may independently be performed in any suitable manner as described before to independently give the first and second preassemblies. A portion of a master batch of the first curable silicone composition may be used in the manufacture of the first electrical device and another portion of the master batch of the first curable silicone composition may be used in the adjusting step. The first electrical device may be manufactured before, alternatively after the adjusting step. Each of the first and second thixotropic Index($\eta_1/\eta_{10}$) values independently may be between 3 and 10. The first and second components of the first electrical device are disposed for thermal, and optionally electrical, operative communication with each other via a first CSM, wherein the first CSM is prepared by the curing of the first curable silicone composition and is characterizable by a volume resistivity of less than 0.020 Ohm-cm, alternatively <0.0010 Ohm-cm, or any one of the other aforementioned volume resistivity values; and a thermal conductivity of 2.97 W/(m*K), alternatively >3 W/(m*K), or any one of the aforementioned Thermal Conductivity values. The third and fourth components of the second electrical device are disposed for thermal, and optionally electrical, operative communication with each other via a second CSM, wherein the second CSM is prepared by the curing of the second curable silicone composition and is characterizable by a volume resistivity of less than 0.020 Ohm-cm, alternatively <0.0010 Ohm-cm, or any one of the other aforementioned volume resistivity values; and a thermal conductivity of 2.97 W/(m*K), alternatively >3 W/(m*K), or any one of the aforementioned Thermal Conductivity values. The volume resistivity of the first and second CSMs may be the same, alternatively may differ from each other, e.g., by <0.0001 Ohm-cm, alternatively <0.00005 Ohm-cm, alternatively <0.00002 Ohm-cm. The thermal conductivity of the first and second CSMs may be the same, alternatively may differ from each other, e.g., by <6, alternatively <5, alternatively <4, alternatively <3, alternatively <2, alternatively <1 W/(m*K).

The manufacturing method may comprise manufacturing more than one electrical device wherein the depositing and/or curing conditions (collectively, manufacturing conditions) are different. For example, the depositing and/or curing conditions may be different from each other in at least one of temperature of the curable silicone composition, rate of flow of the curable silicone composition, cure time of the curable silicone composition, orientation of the substrate when in contact with the curable silicone composition, and chemical composition or structure of the surfaces of the first and second substrates. The rheology may be adjusted without increasing the total concentration of the conductive core such that the thixotropic index($\eta_1/\eta_{10}$) values before and after the rheology adjustment are each between 3 and 10 and differ from each other by at least 0.3, alternatively at least 0.5, alternatively at least 1, alternatively at least 2, alternatively at least 3, alternatively at least 4, alternatively at least 5, all as a result of the adjusting.

As mentioned before, in any of the foregoing embodiments, the depositing the curable silicone composition onto the opposing surfaces of the first and second components may comprise contacting the curable silicone composition to one or both surfaces, and bringing the surfaces into opposition to each other so that the curable silicone composition directly contacts both of the opposing surfaces, or indirectly contacts one or both opposing surfaces independently via an optional interposed adhesive or surface activation layer. Likewise in any of the foregoing embodiments employing same, the depositing the curable silicone composition onto the opposing surfaces of the third and fourth components may comprise contacting the curable silicone composition to one or both surfaces, and bringing the surfaces into opposition to each other so that the curable silicone composition directly contacts both of the opposing surfaces, or indirectly contacts one or both opposing surfaces independently via an optional interposed adhesive or surface activation layer. The contacting of the curable silicone composition to the surfaces may be done sequentially or simultaneously. In the electrical device the first and second components sandwich the curable silicone composition between their opposing surfaces.

The curable silicone composition may be applied to the surface(s) by various methods of deposition. Examples of suitable methods include printing through screen or stencil, dispensing, or other methods such as aerosol, ink jet, gravure, or flexographic, printing. The curable silicone composition may be applied to the surfaces to make direct physical, and electrical- and/or -thermal contact to the first and second components, alternatively the third and fourth components. Curing the applied curable silicone composition gives the CSM in direct physical, and electrical contact to the opposing faces, and enables electrical- and/or -thermal operative communication between the first and second components, alternatively the third and fourth components, via the CSM. Alternatively, an intermediate layer (e.g., an adhesive layer) may be interposed between the CSM and electrical contact, or between any CSM and substrate described herein.

Conditions for the curing typically comprise elevated temperature lead to the substantial removal of the hydrocarbon vehicle. Substantially all of other ingredients of the curable silicone composition are, or react in situ to form components that are, less volatile under the curing conditions than is the hydrocarbon vehicle. Thus, the concentration of Cu—Ag core-shell particles and other ingredients besides the hydrocarbon vehicle are usually higher in the CSM than in the curable silicone composition.

Depending on whether the curable organosiloxane composition is condensation curable, free radical curable or hydrosilylation curable as described earlier, conditions for the curing may further comprise exposure of the curable silicone composition to UV light, peroxides, metal-containing catalyst, and/or moisture. For example, curing the hydrosilylation-curable silicone composition typically comprises heating the hydrosilylation-curable organosiloxane containing the hydrosilylation catalyst to remove a substantial amount of the hydrocarbon vehicle and give the CSM. The curing conditions may facilitate shrinkage of volume of material during curing and result in improved packing of the conductive filler and a CSM with increased electrical conductivity, decreased volume resistivity, or both compared to a CSM that is the same except having a hydrocarbon vehicle with a boiling point below 100° C. (e.g., 50° C.).

Some advantages and benefits of the present invention. The CSM of the invention contains a very low amount of noble metal (<15 wt % Ag), but still demonstrates electrical resistivity below 0.020 Ohm-cm, alternatively <0.0010 Ohm-cm, or any one of the other aforementioned volume resistivity values; and thermal conductivity of 2.97 W/(m*K), alternatively >3 W/(m*K), or any one of the aforementioned Thermal Conductivity values; and maintains its electrical and/or thermal performance for at least 168 hours at 130° C. at 85% relative humidity (RH), and may maintain its electrical and/or thermal performance for at least 1,000 hours under harsh environmental conditions such as damp heat 85C/85% RH. Alternatively or additionally, as mentioned before the curable silicone composition may be curable at a temperature less than or equal to 160° C. This cure temperature is less than temperatures required for sintering the Cu—Ag core-shell particles and less than temperatures required for soldering conductive compositions based on mixtures of electrically conductive and solderable particles. The CSM may also have the elongation at break of at least 50%, alternatively at least any one of the aforementioned elongation at break values described herein.

Alternatively or additionally, the curable silicone composition is stencil/screen printable and dispensable. Also, due to the high amount of solids in it (>80 wt %), the curable silicone composition enables deposition (e.g., printing) of conductive structures with high aspect ratios. Therefore, invention provides embodiments wherein the CSM is in the shape of a stable bond line and achieves optimal electrical and/or thermal performance while using low total silver concentration, and hence lowers cost of the CSM material for cost-sensitive applications such as photovoltaic cell modules or multi-chip packages.

Alternatively or additionally, the CSM of this invention demonstrates primer-less adhesion to a wide range of substrate materials. Beneficially, the CSM also provides adequate bonding to a wide variety of different copper foil surface finishes. Thus, the CSM enable direct and reliable electrical, thermal, and mechanical contact to copper surfaces for the lifetime of a device employing same such as a photovoltaic cell module. Thus, the CSM may benefit many different electrical device industries and technologies.

Alternatively or additionally, in the present invention, the carbon nanotubes are believed to have minimal or no negative effect on electrical conductivity, while enhancing thermal conductivity. While carbon nanotubes generally may impart some electrical conductivity in a cured polymer that would otherwise not be electrically conductive if it lacked carbon nanotubes, instead the present invention advantageously may employ the carbon nanotubes as a concentration-sensitive rheology modifier in the curable silicone composition at concentrations where the carbon nanotubes ultimately have no or minimal negative effect on electrical conductivity of the CSM resulting from curing the curable silicone composition. The carbon nanotubes may enhance thermal conductivity of the CSM compared to a cured product of a comparative composition lacking the carbon nanotubes. The present invention provides the curable silicone composition wherein total concentration of silver in the curable silicone composition is significantly below 15 wt % and wherein the volume resistivity of the resulting CSM can be maintained below 0.020 Ohm-cm, alternatively <0.0010 Ohm-cm, or any one of the other aforementioned volume resistivity values; and a thermal conductivity of 2.97 W/(m*K), alternatively >3 W/(m*K), or any one of the aforementioned Thermal Conductivity values. The present invention advantageously found a way to successfully employ certain secondary filler that functions in an enhancing manner in the present curable silicone composition and CSM without adding other highly conductive metal such as gold or aluminum metals, to the curable silicone composition and CSM. This has enabled lowering the total concentration of silver in a silicone binder matrix to less than 15 wt % (e.g., 7.0 to 12.0 wt %) while still achieving a volume resistivity of the curable silicone composition less than 0.020 Ohm-cm, alternatively <0.0010 Ohm-cm, or any one of the other aforementioned volume resistivity values; and a thermal conductivity of 2.97 W/(m*K), alternatively >3 W/(m*K), or any one of the aforementioned Thermal Conductivity values, without adding other highly conductive metal filler.

Alternatively or additionally, in some embodiments wherein the curable silicone composition further contains the MTF and the MTF comprises carbon nanotubes, the curable silicone composition may advantageously characterizable by a thixotropic index that is adjustable from 3 to 10 (3.0 to 10.0) without increasing the total concentration of silver and Cu—Ag core-shell particles, and wherein the curable silicone composition remains curable to an CSM having a volume resistivity of less than 0.020 Ohm-cm, alternatively <0.0010 Ohm-cm, or any one of the other aforementioned volume resistivity values; and a thermal conductivity of 2.97 W/(m*K), alternatively >3 W/(m*K), or any one of the aforementioned Thermal Conductivity values, and the total concentration of silver in the curable silicone composition is <15 wt % (e.g., from 7.0 to 12 wt %) and the curable silicone composition lacks gold; alternatively, gold and aluminum metals. In such embodiments the rheology of the curable silicone composition may be adjusted over a wide range to accommodate different application requirements for making electrical devices wherein the volume resistivity of the resulting CSM may be maintained below 0.020 Ohm-cm, alternatively <0.0010 Ohm-cm, or any one of the aforementioned volume resistivity values; and a thermal conductivity of 2.97 W/(m*K), alternatively >3 W/(m*K), or any one of the aforementioned Thermal Conductivity values. The manner of adjusting of the thixotropic index may comprise adjusting the combined wt % portion of the Cu—Ag core-shell particles and MTF carbon nanotubes; alternatively raising or lowering the concentration of carbon nanotubes in the curable silicone composition so long as the concentration remains within the wt % range described herein for the carbon nanotubes therein, alternatively raising or lowering the concentration of the hydrocarbon vehicle so long as the concentration of the hydrocarbon vehicle remains within the wt % range described herein for the hydrocarbon vehicle, or a combination of two, alternatively three thereof. Such manners of adjusting are contemplated so long as the thixotropic index changes by at least 0.3, alternatively at least 0.5, alternatively at least 1, alternatively at least 2, alternatively at least 3, alternatively at least 4, alternatively at least 5, all as a result of the adjusting, while the thixotropic index remains greater than 3, the total concentration of the conductive filler does not increase, and the curable silicone composition remains curable to an CSM having a volume resistivity of less than 0.020 Ohm-cm, alternatively <0.0010 Ohm-cm, or any one of the other aforementioned volume resistivity values; and a thermal conductivity of 2.97 W/(m*K), alternatively >3 W/(m*K), or any one of the aforementioned Thermal Conductivity values. Even when the concentration of carbon nanotubes is raised or lowered, the thixotropic index of the CSM prepared from the curable silicone composition may change by a significant amount (e.g., 1 or more) while unexpectedly the volume resistivity of the resulting CSM may remain virtually unchanged (e.g., may change by from 0 to 0.0001, alternatively from 0 to 0.0005, alternatively from 0 to 0.00002 Ohm-cm). Further, while the thixotropic index may be adjusted in this range, the volume resistivity of the resulting CSM may remain virtually unchanged. Further, the present invention may achieve this advantage without using gold, or gold and aluminum. Therefore, in some embodiments, the curable silicone composition and CSM composition lack gold, or gold and aluminum. Alternatively, the adjusting may be achieved without varying concentration of the hydrocarbon vehicle in the curable silicone composition, alternatively the concentration of the hydrocarbon vehicle in the curable silicone composition may be varied by itself or in combination with varying the concentration of the Cu—Ag core-shell particles, any TC-EI filler, and/or any MTF.

Such an adjustable curable silicone composition is useful for developing different curable formulations that meet the varied rheology needs of electrical component/device manufacturing conditions while retaining the CSM electrical and thermal properties needed by end-users of the component/device device. For example, the curable silicone composition has rheology characteristics that are useful for dispensing or screen printing thereof, including for dispensing or screen printing different types of components/devices. The curable silicone composition has sufficient viscosity such that it does not exhibit too much slump, bleeding, dripping, and/or filler settling during dispensing or screen printing thereof. Additionally, the curable silicone composition may not have too much viscosity for successful screen printing. The curable silicone composition has adjustable rheology in order to meet the diverse needs of manufacturers of different electrical devices such as photovoltaic devices, single chip electronic packages, multi-chip electronic packages, and electronic circuit boards while retaining the resulting CSM's electrical and thermal properties needed by the device users.

Determining numerical property values: for purposes of the present invention and unless indicated otherwise, the numerical property values used herein may be determined by the following procedures.

Determining adhesive strength: for purposes of the electrically conductive silicone adhesive aspect of the present invention and unless indicated otherwise, a Peel Resistance Test Method that is in agreement with the test method described in ASTM D6862-04 (*Standard Test Method for 90 Degree Peel Resistance of Adhesives*) has been used. Peel Resistance Test Method: uses a 90-degree peel test to determine the resistance-to-peel strength of a test adhesive bonding a rigid adherent (substrate such as silica glass) and a flexible adherent (e.g., 2 mm wide Cu wire). For purposes of this test method, surfaces of the adherents do not undergo surface priming or treatment prior to adhesive application thereto. Test adhesive is screen printed onto the rigid adherent through apertures of dimension 0.5 mm×114 mm×0.25 mm. Flexible 2 mm wide Cu wire is placed on top of the screen printed test adhesive, and the resulting structure is heat treated at 150° C. for 15 minutes in air environment to give a test sample. The 90-degree peel resistance measurement takes place on a gripping fixture of an INSTRON electromechanical testing system, which gripping fixture allows a constant 90 degree peel angle to be maintained during the test. The test sample is positioned on the INSTRON table, and clamped down on both sides of the test area at a distance of approx 5 mm to minimize flexure. About 3 centimeter (cm) length of the Cu wire is standing out of the measurement zone (i.e., test area where the Cu wire contacts the rigid adherent) and is used for attaching the test sample to a pull tester. For every measurement the Cu wire is bent at a 2 mm distance from the measurement zone and inserted into the gripping fixture. Either an end portion of the Cu wire overhangs the rigid adherent, or the end portion is pulled up by hand from the rigid adherent to debond (physically separate) the end portion of the Cu wire from the rigid adherent without debonding all of the Cu wire therefrom, and the debonded end portion is disposed into the gripping fixture. The force needed to bend the Cu wire is not taken into account since only data obtained with the same type of Cu wire are compared. A 100 Newton (N; equivalent to 20 lbs) load cell and a strain rate of 0.5 inch per minute (1.27 cm/minute) is used and the average peel force over a 15 mm length of travel of the test sample is measured. At least 4 specimens are measured for each test sample to obtain an average peel force, which is what is reported.

Determining adhesive strength for purposes of the thermally conductive silicone adhesive aspect and electrically and thermally conductive silicone adhesive aspect of the present invention and unless indicated otherwise, use a Die Shear Strength Test Method MIL-STD-883J, Method 2019.9 Die shear strength using a Royce Instruments System 552 Die Shear Tester instrument with a test speed of $8.4 \times 10^{-4}$ meters per second (m/s) (0.033 inch/second), and a die shear load module of 50 kilogram-force (kgf). The test is conducted by disposing a test sample (e.g., the curable silicone composition) between substrate 1: AlClad Aluminum mounting; substrate and 2: silicon die, 10 square millimeters (mm$^2$), thermally curing the disposed test sample, and measuring shear strength of the cured test sample in kgf. The shear strength is the force sufficient to shear the silicon die from its Al mounting.

Determining boiling point: measure boiling point by distillation at standard atmospheric pressure of 101.3 kilopascals (kPa).

Determining dynamic viscosity: for purposes of the present invention and unless indicated otherwise, use dynamic viscosity that is measured at 25° C. using a rotational viscometer such as a Brookfield Synchro-lectric viscometer, or Brookfield DV-II+Pro Viscometer/number 52 Spindle, or a Wells-Brookfield Cone/Plate viscometer. The results are generally reported in centipoise. This method is based on according to ASTM D1084-08 (*Standard Test Methods for Viscosity of Adhesives*) Method B for cup/spindle and ASTM D4287-00(2010) (*Standard Test Method for High-Shear Viscosity Using a Cone/Plate Viscometer*) for cone/plate. Dynamic viscosity for purposes of determining thixotropic index is measured according to the TI Test Method described later.

Determining kinematic viscosity: use test method ASTM-D445-11a (*Standard Test Method for Kinematic Viscosity of Transparent and Opaque Liquids (and Calculation of Dynamic Viscosity)*) or using the ASTM D4287-00(2010) test method at 25° C. Expressed in cSt or mm$^2$/s units.

Determining state of matter: Characterize state of matter as solid, liquid, or gas/vapor at 20° C. and a pressure of 101.3 kPa.

Determining Tensile Strength determined by the following Tensile Strength Test Method: using ASTM D412-06a (2013) (*Standard Test Methods for Vulcanized Rubber and Thermoplastic Elastomers—Tension*), Test method A—Dumbbell and straight specimens with an Alpha Technologies Tensometer—2000 apparatus, a load cell of 1000N, and rate of stage speed of 50.8 centimeters (20.0 inches) per minute. Five specimens are tested and median peak stress values were recorded as pounds per square inch (psi) tensile strength and peak strain values were reported as percent elongation-at-break. 1.00 psi=0.00689 megapascal (MPa).

Determining Thermal Conductivity (TC or λ) and Thermal Impedance (Z) were determined by the following Thermal Properties Test Method: Thermal impedance measurements were carried out on a NETZSCH LFA 447 Nanoflash instrument from NETZSCH Instruments, Inc., Burlington, Mass., USA using silicon wafers that were obtained from Pure Wafer Inc., Prescott, Ariz., USA. The Si wafers were 150 millimeter (mm) diameter, double-sided polished wafers of p-type, 1-0-0 orientation, thickness 585-725 microns (μm), resistivity 5-200 Ohm-centimeter (Ω-cm). The silicon wafers were diced to 10 millimeter square Si wafer substrates, rinsed with 2-propanol, and dried. The thermal diffusivity of the Si substrates was measured before applying test samples of the curable silicone composition. To test the thermal impedance of a test composition, the test composition was dispensed on a first Si wafer substrate (Si Wafer 1). A second Si wafer substrate (Si Wafer 2) was placed on top of the dispensed test composition to form a sandwiched assembly in a jig that provided a thin controlled bondline thickness. The assembly was clamped with a binder clip and cured in an oven for 1 hour cure time and at 150° C. cure temperature. After cure, the cured assembly comprised a laminate sequentially comprising the first Si wafer substrate, a TIM of the cured test composition in thermal communication and contact with the first Si wafer substrate, and the second Si wafer substrate in thermal communication and contact with the TIM. This may be abbreviated as Si Wafer 1/TIM/Si Wafer 2, wherein the first "/" depicts the interface between the Si Wafer 1 and the TIM and the second "\" depicts the interface between the TIM and the Si Wafer 2. The cured assembly was removed from the jig, and a graphite coating was applied to both sides thereof (i.e., the exposed exterior surfaces of the first and second Si wafer substrates). The graphite coating was applied to increase energy absorption and emittance from the surfaces of the cured assembly for better test sensitivity. The laser flash method used the NETZSCH LFA 447 Nanoflash instrument and involved rapidly heating one side of the cured assembly with a single pulse from a laser and monitoring the arrival of the resulting temperature disturbance as a function of time on the opposite surface. The thermal impedance of the thin TIM between the two substrates is measured using multi-layer analysis. Technical details of the test method can be found in the instrument manual and Standard Test Method for Thermal Diffusivity of Solids by the Flash Method," ASTM Test Method E 1461-92. Si substrates used for thermal properties measurement: Thermal diffusivity 74.29 millimeters squared per second (mm$^2$/s); density 2.33 grams per cubic centimeter (g/cm$^3$), Cp 0.715 Joules per gram*Kelvin (J/g*K).

Thermal diffusivity (TD) expressed in millimeters squared per second (mm$^2$/s)=TC/[d*Cp]; wherein TC is thermal conductivity expressed in W/(m*K), d is density expressed in grams per cubic centimeter (g/cm$^3$), and Cp is heat capacity expressed in J is joules per grams*Kelvin (J/(g*K)).

Thermal impedance (Z) expressed in centimeters squared or millimeters squared*Celsius per watt [(cm$^2$ or mm$^2$)C/W]: Z=R*A=ΔT/q*A; wherein R is total thermal resistance???, A is area in cm$^2$ or mm$^2$, q is heat flow, and ΔT is temperature difference.

Thermal conductivity (TC or λ) expressed in [W/(m*K)]: λ=(q*t)/(A*ΔT); wherein A is area, q is heat flow, ΔT is temperature difference, and t is length of heat path.

Total thermal resistance for TIM application: R=BLT/TC+$R_{c1}$+$R_{c2}$, wherein BLT is bond line thickness, TC is thermal conductivity, $R_{c1}$ is resistance at the interface between the Si Wafer 1 and the CSM TIM, and $R_{c2}$ is resistance at the interface between the Si Wafer 2 and the CSM TIM.

Determining volume resistivity: The volume resistivity of CSM test samples reported in the Examples below was determined using the following Volume Resistivity Test Method. The volume resistivity was determined using a four-point-probe instrument, GP 4-TEST Pro, from GP Solar GmbH, Germany. This instrument has a line resistance probe head and incorporates Precise Keithley electronics for current sourcing and voltage measurement. The line resistance probe head is constructed to measure electrical resistance through a 5 cm distance along a conductive strip the CSM test sample. An aliquot of the test material was deposited on non-conductive substrate (e.g., silica glass or ceramic) by screen printing through apertures of dimension 5 mm×60 mm×0.25 mm. This formed a uniform line having an area of 5 mm×60 mm=300 mm$^2$. The spread test material was thermally cured by conveying it through an oven set to a temperature of 150° C. under ambient (air) atmosphere for 15 minutes to produce a test sample of the material (e.g., CSM The voltage drop between the two inner probe tips was then measured at a selected current to provide a resistance value in ohms (Ω).

The initial volume resistivity of the cured composition was calculated using the equation $\rho=R(W\times T/L)$ where $\rho$ is the volume resistivity in Ohm-centimeters ($\Omega$-cm), R is the resistance in ohms ($\Omega$) of the cured composition measured between two inner probe tips spaced 5 cm apart, W is the width of the cured layer in cm, T is the thickness of the cured layer in cm, and L is the length of the cured layer between the inner probes in cm. The thickness of the cured layer was determined using a micrometer (Ono Sokki digital indicator number EG-225). If desired, a cross sectional area might be determined more accurately using a Zygo 7300 white light interferometer. Even so, all of the thickness measurements in the below examples were determined with the micrometer. Volume resistivity ($\rho$) in $\Omega$-cm units represents the average value of three measurements each performed on identically prepared test specimens. These measurements have a relative error of less than 10 percent.

Determining thixotropic index($\eta_1/\eta_{10}$): The thixotropic index($\eta_1/\eta_{10}$) is determined using the following TI Test Method. Measure dynamic viscosity ($\eta$) in Pascal-seconds (Pa·s) at 25° C. using an ARES G2 Parallel Plate Rheometer with 40 millimeter diameter plates and a gap of 1 millimeter (Rheometer). Agitate a test sample for 20 seconds at 1,200 revolutions per minute (rpm) with a SPEEDMIXER dual asymmetric centrifugal laboratory mixer (model no. DAC 150 FVZ-K, Haushild & Co. KG, Hamm, Germany). Then immediately load the agitated test sample into the Rheometer for a conditioning step and then a flow sweep step. During the conditioning step, mix the test sample for 300 seconds at a shear rate of 0.001 radians per second to give a conditioned test material. Then during the flow sweep step, measure dynamic viscosity of the conditioned test material at shear rates ranging from 0.001 to 100 radians per second (rad·s$^{-1}$ or rad/s), recording at least five data points per shear rate decade (i.e., record at least five data points at 0.001 rad/s, at least five data points at 0.01 rad/s, etc. up to and including at least five data points at 100 rad/s). The thixotropic index($\eta_1\eta_{10}$) is calculated by dividing the dynamic viscosity values in Pa·s at shear rates of 1 and 10 rad/s, respectively Determining weight percent (wt %): base weight percent of an ingredient of a composition, mixture, or the like on weights of ingredients added to prepare, and total weight of, the composition, mixture, or the like.

Ingredients used in the examples follow.

Hydrocarbon vehicle (HV1) was an isoalkanes mixture containing 80 to 81% ($C_{16}$)isohexadecanes, 3% ($C_{13}$)isotridecanes, and 16 to 17% ($C_{12}$)isododecanes.

Cu—Ag core-shell particles (Cu88-Ag12) were flakes that had 12 wt % Ag and 88 wt % Cu; a D90 particle size of 5.0 μm.

Cu—Ag core-shell particles (Cu90-Ag10) were spheres that had 10 wt % Ag and 90 wt % Cu; a D90 particle size of 6.1 μm.

Multi-walled carbon nanotubes (MWCNT1) had an outer diameter of from 50 to 100 nm and length of from 5 to 20 μm. Derivatized carbon nanotubes (DCNT1) were graphenated MWCNT that had >95 wt % purity, and an outer diameter of from 50 to 80 nm, inner diameter of from 5 to 15 nm, and a length of from 10 to 20 μm.

Vinyl-functionalized Polydimethylsiloxane (VFPDMS1): this primary organosiloxanes was a vinyl-functionalized polydimethylsiloxane having dynamic viscosity of from 40,000 to 70,000 Pa·s.

A chain extender/crosslinker was a trimethylsiloxy-terminated dimethyl methylhydrogensiloxane (CE/CL1) liquid having a dynamic viscosity of 55 cSt (55 mm$^2$/s).

Vinyl-functionalized Polydimethylsiloxane (VFPDMS2): this primary organosiloxanes was a vinyl-functionalized polydimethylsiloxane having dynamic viscosity of from 5,000 to 15,000 Pa·s.

Adhesion promoter 1 (AP1) was an a 3:2 (wt/wt) mixture of bis(alpha,omega-glycidoxyalkyl)-dialkyl/(alkyl,alkenyl) siloxane adhesion promoter with a kinematic viscosity of 17 cSt (17 mm$^2$/s) and bis(alpha,omega-glycidoxyalkyl-D3 to D6 alkyl,hydrogencyclosiloxane), wherein there are two bis(alpha,omega-glycidoxyalkyl-D3 to D6 organo,hydrogencyclosiloxanyl moieties, which are linked to each other via an alkylene-dialkylsiloxanyl-alkylene linker.

Adhesion promoter 2 (AP2) was bis(alpha,omega-glycidoxymethyl-D3 to D6 methyl,hydrogencyclosiloxane) with dynamic viscosity of 0.10 to 0.15 Pa·s.

Catalyst (CAT1) was a microencapsulated platinum catalyst in the form of shell-core particles, wherein CAT1 contained 0.008 wt % Pt, wherein the encapsulant or shell was a cured vinyl-terminated polydimethylsiloxane and the core comprised a platinum-ligand complex.

Fumed Silicas (HPHL and HPHB): AEROSIL 200 hydrophilic fumed silica (HPHL) with a specific surface area (BET) of 200 meters square per gram (m$^2$/g) and AEROSIL 202 hydrophobic fumed silica (HPHB) with a specific surface area (BET) of 100 m$^2$/g. The HPHL and HPHB were obtained from Evonik Industries.

Non-limiting examples of the invention follow. They illustrate some specific embodiments and aforementioned advantages. The invention provides additional embodiments that incorporate any one limitation, alternatively any two limitations, of the Examples, which limitations thereby may serve as a basis for amending claims.

Preparation Method: The curable silicone compositions of the examples were prepared by mixing the Vinyl-functionalized Polydimethylsiloxane 1 or Vinyl-functionalized Polydimethylsiloxane 2 and any multi-walled CNTs or treated CNTs, if used, (or other MTF) to form a master batch (MB1). Mixing to form MB1 was done with an EXAKT Three Roll Mill (model no. 80E, Exakt Advanced Technology) in 5 passes using a 5 to 70 μm gap at 30 revolutions per minute (rpm). To a pot of a 0.5 liter planetary mixer (Custom Milling and Consulting, Fleetwood, Pa., USA) add HV1; AP1; AP2, if any; Cu—Ag1; an aliquot of MB1 if CNTs are used; and Vinyl-functionalized Polydimethylsiloxane 1; and mix resulting contents for 5 minutes at 15 Hertz and 5 minutes at 30 Hertz to wet-out and disperse conductive filler to give a precursor mixture. To the precursor mixture add the chain extender/crosslinker CE/CL1 (or both CECL1 and CE/CL2) and the microencapsulated platinum catalyst (CAT1), and mix gently to prevent heating, and de-air the pot to give a curable silicone composition of any one of Examples 1 to 24. The amounts of the ingredients of the hydrosilylation-curable organosiloxane and the curable silicone composition prepared therefrom were chosen so as to give the wt % concentrations listed below in Tables 1 and 2, respectively.

TABLE 1

Hydrosilylation-curable organosiloxane compositions of Examples 1 to 24.

| Ex. No. | Diorganosiloxane (wt %) | CE/CL1 (wt %) | AP1 (wt %) | AP2 (wt %) | CAT1 (wt %) |
|---|---|---|---|---|---|
| 1 | VFPMDS1 (7.2 wt %) | 0.7 | 0.7 | 0 | 1.4 |
| 2 | VFPMDS1 (6.4 wt %) | 0.2 | 0.7 | 0.5 | 1.4 |

TABLE 1-continued

Hydrosilylation-curable organosiloxane compositions of Examples 1 to 24.

| Ex. No. | Diorgano-siloxane (wt %) | CE/CL1 (wt %) | AP1 (wt %) | AP2 (wt %) | CAT1 (wt %) |
|---|---|---|---|---|---|
| 3 | VFPMDS1 (6.6 wt %) | 0.2 | 0.7 | 0.5 | 1.4 |
| 4 | VFPMDS1 (6.4 wt %) | 0.2 | 0.7 | 0.5 | 1.4 |
| 5 | VFPMDS1 (7.4 wt %) | 0.4 | 0.7 | 0 | 1.4 |
| 6 | VFPMDS2 (7.4 wt %) | 0.4 | 0.7 | 0 | 1.4 |
| 7 | VFPMDS1 (7.4 wt %) | 0.4 | 0.7 | 0 | 1.4 |
| 8 | VFPMDS1 (6.8 wt %) | 0.4 | 0.7 | 0 | 1.3 |
| 9 | VFPMDS1 (7.4 wt %) | 0.4 | 0.7 | 0 | 1.4 |
| 10 | VFPMDS1 (11.1 wt %) | 0.6 | 1.1 | 0 | 2.1 |
| 11 | VFPMDS1 (11.1 wt %) | 0.6 | 1.1 | 0 | 2.1 |
| 12 | VFPMDS1 (6.4 wt %) | 0.2 | 0.7 | 0.5 | 1.4 |
| 13 | VFPMDS1 (6.4 wt %) | 0.2 | 0.7 | 0.5 | 1.4 |
| 14 | VFPMDS1 (6.6 wt %) | 0.2 | 0.7 | 0.5 | 1.4 |
| 15 | VFPMDS1 (6.6 wt %) | 0.2 | 0.7 | 0.5 | 1.4 |
| 16 | VFPMDS1 (6.7 wt %) | 0.2 | 0.7 | 0.5 | 1.5 |
| 17 | VFPMDS1 (7.1 wt %) | 0.2 | 0.8 | 0.6 | 1.6 |
| 18 | VFPMDS1 (7.8 wt %) | 0.2 | 0.9 | 0.6 | 1.7 |
| 19 | VFPMDS1 (9.2 wt %) | 0.3 | 1.0 | 0.7 | 2.0 |
| 20 | VFPMDS1 (6.4 wt %) | 0.2 | 0.7 | 0.5 | 1.4 |
| 21 | VFPMDS1 (6.4 wt %) | 0.2 | 0.7 | 0.5 | 1.4 |
| 22 | VFPMDS1 (6.4 wt %) | 0.2 | 0.7 | 0.5 | 1.4 |
| 23 | VFPMDS1 (6.4 wt %) | 0.2 | 0.7 | 0.5 | 1.4 |
| 24 | VFPMDS1 (6.5 wt %) | 0.2 | 0.7 | 0.5 | 1.4 |

TABLE 2 curable silicone compositions of Examples 1 to 24.

| Ex. No. | Cu88—Ag12 (wt %) | MWCNTs (wt %) | Hydro-carbon Vehicle (wt %) | Organo-siloxane* (wt %) | Other (wt %) |
|---|---|---|---|---|---|
| 1 | 85 | 0.8 | 5 | 10.0 | 0 |
| 2 | 80 | 0.8 | 10 | 10.0 | 0 |
| 3 | 82 | 0.8 | 8 | 10.0 | 0 |
| 4 | 85 | 0.8 | 5 | 9.2 | 0 |
| 5 | 80 | 0 | 10 | 10.0 | 0 |
| 6 | 85 | 0 | 5 | 10.0 | 0 |
| 7 | 85 | 0 | 5 | 10.0 | 0 |
| 8 | 85 | 0.8 | 5 | 9.2 | 0 |
| 9 | 85 | 0 | 5 | 10 | 0 |
| 10 | 80 | 0 | 5 | 15 | 0 |
| 11 | 75 | 0 | 10 | 15 | 0 |
| 12 | 85 | 0 | 5 | 10 | 0 |
| 13 | 86 | 0 | 5 | 10 | 0 |
| 14 | 88 | 0 | 3 | 9 | 0 |
| 15 | 88 | 0 | 2 | 10 | 0 |
| 16 | 89 | 0 | 1 | 10 | 0 |
| 17 | 86 | 0 | 4 | 10 | 0 |
| 18 | 86 | 0 | 3 | 11 | 0 |
| 19 | 86 | 0 | 1 | 13 | 0 |
| 20 | 85 | 0 | 5 | 9.2 | 0.8[a] |
| 21 | 85 | 0 | 5 | 9.2 | 0.8[b] |
| 22 | 85 | 0 | 5 | 9.2 | 0.8[a] |
| 23 | 85 | 0 | 5 | 9.2 | 0.8[b] |
| 24 | 85 | 0 | 4 | 9.3 | 1.6[a] |

*See Table 1 unless noted otherwise;
[a]HPHL fumed silica;
[b]HPHB fumed silica.

The curable silicone compositions (CSCs) of Examples 1 to 24 may be directly characterized by thixotropic index and indirectly by characterizing the CSM resulting from curing the CSCs by placing them for 15 minutes in an oven set to 150° C. The CSM may be characterized by, for example, volume resistivity (ρ) and Thixotropic Index($\eta_1/\eta_{10}$). These characterizations are shown below in Table 3.

TABLE 3 direct characterizations of CSMs prepared by curing the curable silicone compositions (CSC) of Examples 1 to 24.

| CSM Ex. No. | CSC Ex. No. | (CSC) TI ($\eta_1/\eta_{10}$) | CSM ρ (Ohm-cm) | Thermal Conductivity (W/m * K) | Elongation at break (%) |
|---|---|---|---|---|---|
| A | 1 | 3 to 10 | 0.00055 | N/R | N/R |
| B | 2 | 3 to 10 | 0.00047 | N/R | N/R |
| C | 3 | 3 to 10 | 0.00050 | N/R | N/R |
| D | 4 | 4.0 to 4.5 | 0.0004 | 9.7[a] | 100 |
| E | 5 | N/R | 0.00083 | N/R | N/R |
| F | 6 | N/R | 0.00042 | N/R | N/R |
| G | 7 | N/R | 0.00045 | N/R | N/R |
| H | 8 | 4.0 to 4.5 | 0.0004 | 9.3 | 114 |
| I | 9 | N/R | 0.00050 | N/R | N/R |
| J | 10 | N/R | 0.013 | N/R | N/R |
| K | 11 | N/R | 0.0082 | N/R | N/R |
| L | 12 | N/R | N/R | 5.3 | N/R |
| M | 13 | N/R | N/R | 7.5 | 163 |
| N | 14 | N/R | N/R | 5.1 | N/R |
| O | 15 | N/R | N/R | 4.5 | N/R |
| P | 16 | N/R | N/R | 3.0 | N/R |
| Q | 17 | N/R | N/R | N/R | N/R |
| R | 18 | N/R | N/R | N/R | N/R |
| S | 19 | N/R | N/R | N/R | N/R |
| T | 20 | N/R | N/R | 4.8 | 125 |
| U | 21 | N/R | N/R | 3.0 | 125 |
| V | 22 | N/R | N/R | 5.3 | N/R |
| W | 23 | N/R | N/R | 3.5 | N/R |
| X | 24 | N/R | N/R | 4.3 | N/R |

CSC = curable silicone composition;
CSM = conductive silicone material;
N/R means not reported;
[a]another sample, which was processed differently than described above for Thermal Properties Test Method, gave 6.6 W/m * K).

As illustrated by the foregoing examples and described above, the total silver concentration may be kept below 15 wt %, e.g., from 9 to <11 wt % and yet the volume resistivity of the resulting CSM remains below 0.020 Ohm-cm, alternatively <0.0010 Ohm-cm, alternatively <0.00090 Ohm-cm, alternatively <0.00080 Ohm-cm, alternatively <0.00070 Ohm-cm, alternatively <0.00060 Ohm-cm, alternatively <0.00050 Ohm-cm, alternatively <0.00040 Ohm-cm. In some embodiments the thermal conductivity is greater than or equal to 2.9 W/(m*K), alternatively ≥3.0 W/(m*K), alternatively ≥4.0 W/(m*K), alternatively ≥5.0 W/(m*K), alternatively ≥6.0 W/(m*K), alternatively ≥7.0 W/(m*K), alternatively ≥8.0 W/(m*K), alternatively ≥9.0 W/(m*K), or any one of the aforementioned thermal conductivity values, all measured according to Thermal Properties Test Method. Alternatively or additionally, the CSM has a thermal conductivity of less than 15 W/(m*K), alternatively <14 W/(m*K), alternatively <13 W/(m*K), alternatively <12 W/(m*K), alternatively <11 W/(m*K). In some embodiments the elongation at break of at least 50%, alternatively >70%, alternatively >90%, alternatively 100%, alternatively >110%, alternatively >120%. Additionally, the elongation at break may be at most 200%, alternatively ≤180%, alternatively <170%. In some embodiments, the thixotropic index of the curable silicone composition may be adjusted in the range from 3 to 10, alternatively from 4 to 10 (e.g., 3.8 to 9) by employing an MTF that is carbon nanotubes and varying concentration of carbon nanotubes within a range of from 0.1 to 2 wt % (e.g., from 0.60 to 1.0 wt %). The foregoing wt % values are based on weight of the curable silicone composition. Embodiments of the present invention method include such adjusting.

In embodiments of the invention desiring very low volume resistivity, such embodiments may exclude the CSMs of Examples J and K; alternatively the curable silicone compositions of Examples 10 and 11 and the CSMs of Examples J and K.

The below claims are incorporated by reference here as correspondingly numbered aspects except where "claim and "claims" are rewritten as "aspect" and "aspects".

What is claimed is:

1. A curable silicone composition comprising a curable organosiloxane composition, copper-silver (Cu—Ag) core-shell particles, a mechanical thixotropic filler that is carbon nanotubes, and hydrocarbon vehicle; the curable silicone composition being characterized by: a concentration of the Cu—Ag core-shell particles of from 80 to 89 weight percent and a total concentration of silver of from 7 to 12 weight percent, all based on weight of the curable silicone composition; wherein the curable silicone composition has a concentration of the Cu—Ag core-shell particles and hydrocarbon vehicle such that the curable silicone composition remains curable to a conductive silicone material having a concentration of the Cu—Ag core-shell particles of from 88.0 to 92 weight percent and having a volume resistivity of less than 0.020 Ohm-centimeter measured according to Volume Resistivity Test Method and a thermal conductivity of greater than or equal to 2.9 Watts per meter*Kelvin measured according to Thermal Properties Test Method; wherein the curable silicone composition is characterized by a Thixotropic Index($\eta_1/\eta_{10}$) of from 3 to 10.

2. A curable silicone composition comprising a blend of the following ingredients:
a hydrocarbon vehicle at a concentration of from 1 to 15 weight percent based on weight of the curable silicone composition, wherein the hydrocarbon vehicle is characterized by a boiling point from 100 to 360 degrees Celsius;
a curable organosiloxane composition at a concentration of from 8 to 16 weight percent based on weight of the curable silicone composition;
Cu—Ag core-shell particles at a concentration of from 70 to 89 weight percent based on weight of the curable silicone composition; and
a mechanical thixotropic filler that is carbon nanotubes;

wherein the total concentration of silver is from 9 to 12 weight percent based on weight of the curable silicone composition; wherein the curable silicone composition has a concentration of the Cu—Ag core-shell particles and hydrocarbon vehicle such that the curable silicone composition remains curable to a conductive silicone material having a concentration of the Cu—Ag core-shell particles of from 88.0 to 92 weight percent and having a volume resistivity of less than 0.020 Ohm-centimeter measured according to Volume Resistivity Test Method and a thermal conductivity of greater than or equal to 2.9 Watts per meter*Kelvin (W/(m*K)) measured according to Thermal Properties Test Method; and wherein the curable silicone composition is characterized by a Thixotropic Index($\eta_1/\eta_{10}$) of from 3 to 10.

3. The curable silicone composition of claim 2 characterized by a volume resistivity less than 0.0010 Ohm-centimeter measured according to Volume Resistivity Test Method and a thermal conductivity of greater than or equal to 3 Watts per meter*Kelvin measured according to Thermal Properties Test Method.

4. The curable silicone composition of claim 2 characterized by the following limitations:

wherein the hydrocarbon vehicle is an alkanes mixture of different molecules wherein the lowest boiling alkanes molecules have an initial boiling point greater than 150 degrees Celsius and the highest boiling alkanes molecules have an end boiling less than 300 degrees Celsius and the hydrocarbon vehicle is at a concentration of from 1 to 15 weight percent based on weight of the curable silicone composition;

wherein the curable organosiloxane composition comprises at least one diorganosiloxane compound, a catalyst, and an adhesion promoter; wherein the at least one diorganosiloxane compound has on average per molecule at least 1 reactive moiety, wherein each reactive moiety independently is an alkenyl moiety, Si—H moiety, Si—OH moiety, Si—OR moiety, wherein R is ($C_1$-$C_{10}$)hydrocarbyl, —C(O)($C_1$-$C_{10}$)hydrocarbyl, or —N=CR$^1$R$^2$, wherein each of R$^1$ and R$^2$ independently is ($C_1$-$C_{10}$)hydrocarbyl or R$^1$ and R$^2$ are taken together to form a ($C_2$-$C_{10}$)hydrocarbylene; and wherein the at least one diorganosiloxane compound is at least 50 weight percent of the curable organosiloxane composition;

wherein the Cu—Ag core-shell particles are unsintered and are at a concentration of from 75 to 89 weight percent based on weight of the curable silicone composition;

wherein the total concentration of silver is from 9.1 to 12 weight percent based on weight of the curable silicone composition;

wherein the mechanical thixotropic filler is carbon nanotubes, wherein the carbon nanotubes are at a concentration of from 0.1 to 5.0 weight percent based on weight of the curable silicone composition; and wherein the curable silicone composition is characterized by a volume resistivity less than 0.0010 Ohm-centimeter measured according to Volume Resistivity Test Method and a thermal conductivity of greater than or equal to 4 Watts per meter*Kelvin measured according to Thermal Properties Test Method.

5. The curable silicone composition of claim 4, characterized by the following limitations:
wherein the hydrocarbon vehicle is an alkanes mixture;
wherein the curable organosiloxane composition comprises at least one diorganosiloxane compound, at least one organohydrogensilicon compound, a hydrosilylation catalyst, and an epoxy-functional adhesion promoter; wherein the at least one diorganosiloxane compound has on average per molecule at least 1 alkenyl moiety and the organohydrogensilicon compound has on average per molecule at least 1 Si—H moiety; and wherein the at least one diorganosiloxane compound is from 60 to 80 wt % of the curable organosiloxane composition;
wherein the Cu—Ag core-shell particles are at a concentration of from 79.5 to 86.4 weight percent based on weight of the curable silicone composition;
wherein the total concentration of silver is from 9.5 to 12 weight percent based on weight of the curable silicone composition; and
wherein the carbon nanotubes are single-walled carbon nanotubes, multi-walled carbon nanotubes, derivatized carbon nanotubes or a combination of any two or more of the single-walled carbon nanotubes, multi-walled carbon nanotubes, and derivatized carbon nanotubes; and the concentration of carbon nanotubes is from 0.2 to 2 weight percent based on weight of the curable silicone composition.

6. The curable silicone composition of claim 5, characterized by the following limitations:
wherein the alkanes mixture is an isoalkanes mixture comprising at least two of $(C_9-C_{12})$isoalkanes, at least two of $(C_{12}-C_{16})$isoalkanes or at least two of $(C_{16}-C_{22})$ isoalkanes and the hydrocarbon vehicle is at a concentration of from 1.5 to 15 weight percent based on weight of the curable silicone composition;
wherein the curable organosiloxane composition is hydrosilylation curable and comprises the at least one diorganosiloxane compound, the at least one trimethylsiloxy-terminated dimethyl organohydrogensilicon compound, a microencapsulated hydrosilylation catalyst, and a bis(alpha,omega-glycidoxyalkyl)-dialkyl/(alkyl,alkenyl)siloxane; wherein the alkenyl of the diorganosiloxane is vinyl and the at least one diorganosiloxane compound has on average per molecule at least 1.1 vinyl moieties, the at least one trimethylsiloxy-terminated dimethyl organohydrogensilicon compound is and has on average per molecule at least 1.1 Si—H moieties, or the least one diorganosiloxane compound has on average per molecule at least 1.1 vinyl moieties and the at least one organohydrogensilicon compound has on average per molecule at least 1.1 Si—H moieties; wherein the at least one diorganosiloxane compound having vinyl moieties is from 70 to 75 wt % of the curable organosiloxane composition; wherein the at least one trimethylsiloxy-terminated dimethyl organohydrogensilicon compound is from 1 to 5 weight percent, the microencapsulated hydrosilylation catalyst is from 10 to 15 weight percent, and the bis(alpha,omega-glycidoxyalkyl)-dialkyl/(alkyl,alkenyl)siloxane is from 5 to 10 weight percent, and together the organohydrogensilicon compound, microencapsulated hydrosilylation catalyst, and the bis(alpha,omega-glycidoxyalkyl-D3 to D6 alkyl,hydrogencyclosiloxane are from 20 to 30 wt % of the curable organosiloxane composition;
wherein the Cu—Ag core-shell particles are at a concentration of from 79.9 to 86.0 weight percent based on weight of the curable silicone composition;
wherein the total concentration of silver is from 10.0 to 11.0 weight percent based on weight of the curable silicone composition; and
wherein the carbon nanotubes are multi-walled carbon nanotubes at a concentration of from 0.50 to 1.5 weight percent based on weight of the curable silicone composition; and
wherein the curable silicone composition is characterized by a volume resistivity less than 0.00090 Ohm-centimeter measured according to Volume Resistivity Test Method and a thermal conductivity of greater than or equal to 5 Watts per meter*Kelvin measured according to Thermal Properties Test Method.

7. A conductive silicone material that is a product of curing the curable silicone composition of claim 2, wherein the conductive silicone material is characterized by a concentration of the Cu—Ag core-shell particles of from 88.0 to 92 weight percent, a volume resistivity of less than 0.0010 Ohm-centimeter measured according to Volume Resistivity Test Method, and a thermal conductivity of greater than or equal to 2.9 Watts per meter*Kelvin measured according to Thermal Properties Test Method; wherein some of the hydrocarbon vehicle remains in the conductive silicone adhesive after curing such that the conductive silicone adhesive has less than 5 weight percent of the hydrocarbon vehicle.

8. The conductive silicone material of claim 7 further characterized by an elongation at break of at least 50 percent measured according to the Tensile Strength Test Method.

9. An electrical device sequentially comprising a heat generating electrical component, the conductive silicone material of claim 7 disposed in thermal communication and contact with the heat generating electrical component, and a heat dissipator in thermal communication and contact with the conductive silicone material.

10. An electronic device comprising:
a first electronic component,
a second component, and
the conductive silicone material of claim 7 as a thermal interface material (TIM), wherein the TIM is interposed between and in independent thermal communication with the first electronic component and the second component.

11. A method of manufacturing an electrical device comprising first and second components having surfaces and a conductive silicone material, the method comprising depositing the curable silicone composition of claim 2 onto one or both surfaces of the first and second components, and orienting the first and second components so that their surfaces are opposing each other to give a preassembly comprising the curable silicone composition disposed between and in physical contact with the opposing surfaces of the first and second components; and curing the curable silicone composition between the opposing surfaces of the first and second components to give an electrical device comprising the first and second components and a conductive silicone material disposed between and in adhering operative contact with the opposing surfaces of the first and second components such that the first and second components are disposed for thermal operative communication with each other via the conductive silicone material, wherein the conductive silicone material is characterized by a concentration of the Cu—Ag core-shell particles of from 88.0 to 92 weight percent, a volume resistivity of less than 0.020

Ohm-centimeter measured according to Volume Resistivity Test Method, and a thermal conductivity of greater than or equal to 2.9 Watts per meter*Kelvin measured according to Thermal Properties Test Method, and wherein the first component is a heat generating electrical component and the second component is a heat dissipator; wherein some of the hydrocarbon vehicle remains in the conductive silicone adhesive after curing such that the conductive silicone adhesive has less than 5 weight percent of the hydrocarbon vehicle.

12. A method of preparing a thermally conductive material, the method comprising curing the curable silicone composition of claim 2 to give a product of curing thereof as a curable thermally conductive material having a concentration of the Cu—Ag core-shell particles of from 88.0 to 92 weight percent and having a thermal conductivity of greater than or equal to 2.9 W/(m*K) measured according to Thermal Properties Test Method; wherein some of the hydrocarbon vehicle remains in the conductive silicone adhesive after curing such that the conductive silicone adhesive has less than 5 weight percent of the hydrocarbon vehicle.

13. A curable silicone composition comprising a blend of the following ingredients:
an isoalkanes mixture comprising at least three of ($C_{12}$-$C_{16}$)isoalkanes and wherein the lowest boiling isoalkanes molecules have an initial boiling point of greater than 210 degrees Celsius and the highest boiling isoalkanes molecules have an end boiling point of less than 270 degrees Celsius and the hydrocarbon vehicle is at a concentration of from 4.5 to 12 weight percent based on weight of the curable silicone composition;
a hydrosilylation-curable polydimethylsiloxane composition comprising at least one vinyl-functional polydimethylsiloxane compound having on average per molecule at least 1 vinyl moieties, at least one trimethylsiloxy-terminated dimethyl methylhydrogensilicon compound having on average per molecule at least 1.1 Si—H moieties, a microencapsulated platinum hydrosilylation catalyst, and bis(alpha,omega-glycidoxyalkyl)-dialkyl/(alkyl,alkenyl)siloxane, and bis(alpha,omega-glycidoxyalkyl-D3 to D6 alkyl,hydrogencyclosiloxane; and wherein the vinyl-functional polydimethylsiloxane compound is from 70 to 75 weight percent, the trimethylsiloxy-terminated dimethyl methylhydrogensilicon compound is from 1 to 5 weight percent, the microencapsulated hydrosilylation catalyst is from 10 to 15 weight percent, the bis(alpha,omega-glycidoxyalkyl)-dialkyl/(alkyl,alkenyl)siloxane is from 1 to 10 weight percent, and the bis(alpha,omega-glycidoxyalkyl-D3 to D6 alkyl,hydrogencyclosiloxane is from 0 to 7 weight percent, all of the curable polydimethylsiloxane composition; and wherein together the trimethylsiloxy-terminated dimethyl methylhydrogensilicon compound, microencapsulated hydrosilylation catalyst, and the bis(alpha,omega-glycidoxyalkyl)-dialkyl/(alkyl,alkenyl) siloxane, and bis(alpha,omega-glycidoxyalkyl-D3 to D6 alkyl,hydrogencyclosiloxane are from 20 to 30 wt % of the curable organosiloxane composition;
Cu—Ag core-shell particles are at a concentration of from 70 to 89 weight percent based on weight of the curable silicone composition;
wherein the total concentration of silver is from 7.5 to 12.0 weight percent based on weight of the curable silicone composition; and
carbon nanotubes at a concentration of from 0.50 to 1.2 weight percent based on weight of the curable silicone composition; and
wherein the curable silicone composition has a concentration of the Cu—Ag core-shell particles and hydrocarbon vehicle such that the curable silicone composition is curable to a cured silicone material characterized by a concentration of the Cu—Ag core-shell particles of from 88.4 to 90.4 weight percent, a volume resistivity less than 0.00090 Ohm-centimeter measured according to Volume Resistivity Test Method, and a thermal conductivity of greater than or equal to 5 Watts per meter*Kelvin measured according to Thermal Properties Test Method.

14. The curable silicone composition of claim 13, wherein the curable silicone composition is characterized by a Thixotropic Index($\eta_1/\eta_{10}$) of from 3 to 10.

15. A curable silicone composition comprising a blend of the following ingredients:
a hydrocarbon vehicle at a concentration of from 1 to 15 weight percent based on weight of the curable silicone composition, wherein the hydrocarbon vehicle is characterized by a boiling point from 100 to 360 degrees Celsius;
a curable organosiloxane composition at a concentration of from 8 to 16 weight percent based on weight of the curable silicone composition;
Cu—Ag core-shell particles at a concentration of from 70 to 89 weight percent based on weight of the curable silicone composition; and
a mechanical thixotropic filler that is carbon nanotubes; wherein the total concentration of silver is from 9 to 12 weight percent based on weight of the curable silicone composition; wherein the curable silicone composition has a concentration of the Cu—Ag core-shell particles and hydrocarbon vehicle such that the curable silicone composition remains curable to a conductive silicone material having a concentration of the Cu—Ag core-shell particles of from 88.0 to 92 weight percent and having a volume resistivity of less than 0.00090 Ohm-centimeter measured according to Volume Resistivity Test Method and a thermal conductivity of greater than or equal to 9 Watts per meter*Kelvin (W/(m*K)) measured according to Thermal Properties Test Method.

16. The curable silicone composition of claim 15, wherein the curable silicone composition is characterized by a Thixotropic Index($\eta_1/\eta_{10}$) of from 3 to 10.

* * * * *